United States Patent
Tung et al.

(10) Patent No.: US 8,964,280 B2
(45) Date of Patent: Feb. 24, 2015

(54) METHOD OF MANUFACTURING MEMS DEVICES PROVIDING AIR GAP CONTROL

(75) Inventors: Ming-Hau Tung, San Francisco, CA (US); Lior Kogut, Sunnyvale, CA (US)

(73) Assignee: Qualcomm MEMS Technologies, Inc., San Diego, CA (US)

( * ) Notice: Subject to any disclaimer, the term of this patent is extended or adjusted under 35 U.S.C. 154(b) by 158 days.

(21) Appl. No.: 13/356,447

(22) Filed: Jan. 23, 2012

(65) Prior Publication Data

US 2012/0122259 A1 May 17, 2012

Related U.S. Application Data

(60) Continuation of application No. 12/436,059, filed on May 5, 2009, now Pat. No. 8,102,590, which is a division of application No. 11/478,702, filed on Jun. 30, 2006, now Pat. No. 7,527,998.

(51) Int. Cl.
*G02B 26/00* (2006.01)

(52) U.S. Cl.
USPC .......................................... 359/290; 359/291

(58) Field of Classification Search
CPC ....................................................... G02B 7/102
USPC ................................................... 359/290, 291
See application file for complete search history.

(56) References Cited

U.S. PATENT DOCUMENTS

| | | |
|---|---|---|
| 2,534,846 A | 12/1950 | Ambrose et al. |
| 2,590,906 A | 4/1952 | Tripp |
| 2,677,714 A | 5/1954 | Auwarter |
| 3,037,189 A | 5/1962 | Barrett et al. |
| 3,210,757 A | 10/1965 | Jacob |
| 3,247,392 A | 4/1966 | Thelen |
| 3,439,973 A | 4/1969 | Bernt et al. |
| 3,443,854 A | 5/1969 | Herbert |
| 3,653,741 A | 4/1972 | Alvin |
| 3,656,836 A | 4/1972 | Baudoin et al. |
| 3,679,313 A | 7/1972 | Rosenberg |
| 3,701,586 A | 10/1972 | Goetz |

(Continued)

FOREIGN PATENT DOCUMENTS

| | | |
|---|---|---|
| CN | 101924058 A | 12/2010 |
| DE | 4108966 A1 | 9/1992 |

(Continued)

OTHER PUBLICATIONS

Office Action dated Dec. 4, 2012 in Chinese App. No. 200780024852.2.

(Continued)

*Primary Examiner* — James Jones
(74) *Attorney, Agent, or Firm* — Knobbe, Martens, Olson & Bear LLP

(57) ABSTRACT

Methods and apparatus are provided for controlling a depth of a cavity between two layers of a light modulating device. A method of making a light modulating device includes providing a substrate, forming a sacrificial layer over at least a portion of the substrate, forming a reflective layer over at least a portion of the sacrificial layer, and forming one or more flexure controllers over the substrate, the flexure controllers configured so as to operably support the reflective layer and to form cavities, upon removal of the sacrificial layer, of a depth measurably different than the thickness of the sacrificial layer, wherein the depth is measured perpendicular to the substrate.

38 Claims, 18 Drawing Sheets

(56) References Cited

U.S. PATENT DOCUMENTS

| | | |
|---|---|---|
| 3,725,868 A | 4/1973 | Malmer, Jr. et al. |
| 3,728,030 A | 4/1973 | Hawes |
| 3,813,265 A | 5/1974 | Marks |
| 3,886,310 A | 5/1975 | Guldberg |
| 3,955,190 A | 5/1976 | Teraishi |
| 3,955,880 A | 5/1976 | Lierke |
| 4,099,854 A | 7/1978 | Decker et al. |
| 4,196,396 A | 4/1980 | Smith |
| 4,228,437 A | 10/1980 | Shelton |
| 4,377,324 A | 3/1983 | Durand et al. |
| 4,389,096 A | 6/1983 | Hori et al. |
| 4,392,711 A | 7/1983 | Moraw et al. |
| 4,403,248 A | 9/1983 | te Velde |
| 4,421,381 A | 12/1983 | Ueda et al. |
| 4,425,572 A | 1/1984 | Takafuji et al. |
| 4,441,789 A | 4/1984 | Pohlack |
| 4,441,791 A | 4/1984 | Hornbeck |
| 4,445,050 A | 4/1984 | Marks |
| 4,459,182 A | 7/1984 | Te Velde |
| 4,482,213 A | 11/1984 | Piliavin et al. |
| 4,497,974 A | 2/1985 | Deckman et al. |
| 4,498,953 A | 2/1985 | Cook et al. |
| 4,500,171 A | 2/1985 | Penz et al. |
| 4,519,676 A | 5/1985 | Te Velde |
| 4,531,126 A | 7/1985 | Sadones |
| 4,560,435 A | 12/1985 | Brown et al. |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,655,554 A | 4/1987 | Armitage |
| 4,662,746 A | 5/1987 | Hornbeck |
| 4,663,083 A | 5/1987 | Marks |
| 4,666,254 A | 5/1987 | Itoh et al. |
| 4,672,254 A | 6/1987 | Dolat et al. |
| 4,681,403 A | 7/1987 | te Velde et al. |
| 4,705,361 A | 11/1987 | Frazier et al. |
| 4,710,732 A | 12/1987 | Hornbeck |
| 4,748,366 A | 5/1988 | Taylor |
| 4,779,959 A | 10/1988 | Saunders |
| 4,786,128 A | 11/1988 | Birnbach |
| 4,790,635 A | 12/1988 | Apsley |
| 4,822,993 A | 4/1989 | Dillon et al. |
| 4,856,863 A | 8/1989 | Sampsell et al. |
| 4,857,978 A | 8/1989 | Goldburt et al. |
| 4,859,060 A | 8/1989 | Katagiri et al. |
| 4,880,493 A | 11/1989 | Ashby et al. |
| 4,895,500 A | 1/1990 | Hok et al. |
| 4,896,033 A | 1/1990 | Gautier |
| 4,900,136 A | 2/1990 | Goldburt et al. |
| 4,900,395 A | 2/1990 | Syverson et al. |
| 4,925,259 A | 5/1990 | Emmett |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,973,131 A | 11/1990 | Carnes |
| 4,982,184 A | 1/1991 | Kirkwood |
| 5,014,259 A | 5/1991 | Goldberg et al. |
| 5,018,256 A | 5/1991 | Hornbeck |
| 5,022,745 A | 6/1991 | Zayhowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,062,689 A | 11/1991 | Koehler |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,091,983 A | 2/1992 | Lukosz |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,170,283 A | 12/1992 | O'Brien et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,212,582 A | 5/1993 | Nelson |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,285,196 A | 2/1994 | Gale |
| 5,287,096 A | 2/1994 | Thompson et al. |
| 5,293,272 A | 3/1994 | Jannson et al. |
| 5,296,950 A | 3/1994 | Lin et al. |
| 5,305,640 A | 4/1994 | Boysel et al. |
| 5,311,360 A | 5/1994 | Bloom et al. |
| 5,312,513 A | 5/1994 | Florence et al. |
| 5,315,370 A | 5/1994 | Bulow |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,331,454 A | 7/1994 | Hornbeck |
| 5,339,116 A | 8/1994 | Urbanus et al. |
| 5,345,328 A | 9/1994 | Fritz et al. |
| 5,355,357 A | 10/1994 | Yamamori et al. |
| 5,358,601 A | 10/1994 | Cathey |
| 5,365,283 A | 11/1994 | Doherty et al. |
| 5,367,878 A | 11/1994 | Muntz et al. |
| 5,381,232 A | 1/1995 | Van Wijk |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,452,138 A | 9/1995 | Mignardi et al. |
| 5,454,904 A | 10/1995 | Ghezzo et al. |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,471,341 A | 11/1995 | Warde et al. |
| 5,474,865 A | 12/1995 | Vasudev |
| 5,485,304 A | 1/1996 | Kaeriyama |
| 5,489,952 A | 2/1996 | Gove et al. |
| 5,497,172 A | 3/1996 | Doherty et al. |
| 5,497,197 A | 3/1996 | Gove et al. |
| 5,499,037 A | 3/1996 | Nakagawa et al. |
| 5,499,062 A | 3/1996 | Urbanus |
| 5,500,635 A | 3/1996 | Mott |
| 5,500,761 A | 3/1996 | Goossen et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |

(56) References Cited

U.S. PATENT DOCUMENTS

| | | |
|---|---|---|
| 5,526,688 A | 6/1996 | Boysel et al. |
| 5,526,951 A | 6/1996 | Bailey et al. |
| 5,528,707 A | 6/1996 | Sullivan et al. |
| 5,535,047 A | 7/1996 | Hornbeck |
| 5,548,301 A | 8/1996 | Kornher et al. |
| 5,550,373 A | 8/1996 | Cole et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,561,523 A | 10/1996 | Blomberg et al. |
| 5,563,398 A | 10/1996 | Sampsell |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,614,937 A | 3/1997 | Nelson |
| 5,619,059 A | 4/1997 | Li et al. |
| 5,619,061 A | 4/1997 | Goldsmith et al. |
| 5,619,365 A | 4/1997 | Rhoads et al. |
| 5,619,366 A | 4/1997 | Rhoads et al. |
| 5,629,790 A | 5/1997 | Neukermans et al. |
| 5,633,652 A | 5/1997 | Kanbe et al. |
| 5,636,052 A | 6/1997 | Arney et al. |
| 5,636,185 A | 6/1997 | Brewer et al. |
| 5,638,084 A | 6/1997 | Kalt |
| 5,638,946 A | 6/1997 | Zavracky |
| 5,641,391 A | 6/1997 | Hunter et al. |
| 5,646,729 A | 7/1997 | Koskinen et al. |
| 5,646,768 A | 7/1997 | Kaeriyama |
| 5,650,881 A | 7/1997 | Hornbeck |
| 5,654,741 A | 8/1997 | Sampsell et al. |
| 5,657,099 A | 8/1997 | Doherty et al. |
| 5,659,374 A | 8/1997 | Gale, Jr. et al. |
| 5,661,591 A | 8/1997 | Lin et al. |
| 5,661,592 A | 8/1997 | Bornstein et al. |
| 5,665,997 A | 9/1997 | Weaver et al. |
| 5,673,139 A | 9/1997 | Johnson |
| 5,673,785 A | 10/1997 | Schlaak et al. |
| 5,677,783 A | 10/1997 | Bloom et al. |
| 5,683,591 A | 11/1997 | Offenberg |
| 5,686,979 A | 11/1997 | Weber et al. |
| 5,699,181 A | 12/1997 | Choi |
| 5,703,710 A | 12/1997 | Brinkman et al. |
| 5,710,656 A | 1/1998 | Goossen |
| 5,719,068 A | 2/1998 | Suzawa et al. |
| 5,726,480 A | 3/1998 | Pister |
| 5,734,177 A | 3/1998 | Sakamoto |
| 5,739,945 A | 4/1998 | Tayebati |
| 5,740,150 A | 4/1998 | Uchimaru et al. |
| 5,745,193 A | 4/1998 | Urbanus et al. |
| 5,745,281 A | 4/1998 | Yi et al. |
| 5,751,469 A | 5/1998 | Arney et al. |
| 5,771,116 A | 6/1998 | Miller et al. |
| 5,771,321 A | 6/1998 | Stern |
| 5,784,190 A | 7/1998 | Worley |
| 5,784,212 A | 7/1998 | Hornbeck |
| 5,786,927 A | 7/1998 | Greywall et al. |
| 5,793,504 A | 8/1998 | Stoll |
| 5,795,208 A | 8/1998 | Hattori |
| 5,808,780 A | 9/1998 | McDonald |
| 5,808,781 A | 9/1998 | Arney et al. |
| 5,815,141 A | 9/1998 | Phares |
| 5,818,095 A | 10/1998 | Sampsell |
| 5,825,528 A | 10/1998 | Goossen |
| 5,835,255 A | 11/1998 | Miles |
| 5,838,484 A | 11/1998 | Goossen et al. |
| 5,842,088 A | 11/1998 | Thompson |
| 5,867,302 A | 2/1999 | Fleming |
| 5,870,221 A | 2/1999 | Goossen |
| 5,880,921 A | 3/1999 | Tham et al. |
| 5,881,449 A | 3/1999 | Ghosh et al. |
| 5,905,482 A | 5/1999 | Hughes et al. |
| 5,912,758 A | 6/1999 | Knipe et al. |
| 5,914,804 A | 6/1999 | Goossen |
| 5,920,418 A | 7/1999 | Shiono et al. |
| 5,933,183 A | 8/1999 | Enomoto et al. |
| 5,943,158 A | 8/1999 | Ford et al. |
| 5,949,571 A | 9/1999 | Goossen et al. |
| 5,959,763 A | 9/1999 | Bozler et al. |
| 5,961,848 A | 10/1999 | Jacquet et al. |
| 5,986,796 A | 11/1999 | Miles |
| 5,994,174 A | 11/1999 | Carey et al. |
| 6,002,661 A | 12/1999 | Abe et al. |
| 6,028,689 A | 2/2000 | Michalicek et al. |
| 6,028,690 A | 2/2000 | Carter et al. |
| 6,031,653 A | 2/2000 | Wang |
| 6,038,056 A | 3/2000 | Florence et al. |
| 6,040,937 A | 3/2000 | Miles |
| 6,046,659 A | 4/2000 | Loo et al. |
| 6,046,840 A | 4/2000 | Huibers |
| 6,049,317 A | 4/2000 | Thompson et al. |
| 6,055,090 A | 4/2000 | Miles |
| 6,056,406 A | 5/2000 | Park |
| 6,061,075 A | 5/2000 | Nelson et al. |
| 6,065,424 A | 5/2000 | Shacham-Diamand et al. |
| 6,097,145 A | 8/2000 | Kastalsky et al. |
| 6,099,132 A | 8/2000 | Kaeriyama |
| 6,100,861 A | 8/2000 | Cohen et al. |
| 6,100,872 A | 8/2000 | Aratani et al. |
| 6,113,239 A | 9/2000 | Sampsell et al. |
| 6,124,851 A | 9/2000 | Jacobson |
| 6,147,790 A | 11/2000 | Meier et al. |
| 6,154,586 A | 11/2000 | MacDonald et al. |
| 6,158,156 A | 12/2000 | Patrick |
| 6,160,833 A | 12/2000 | Floyd et al. |
| 6,171,945 B1 | 1/2001 | Mandal et al. |
| 6,172,797 B1 | 1/2001 | Huibers |
| 6,180,428 B1 | 1/2001 | Peeters et al. |
| 6,195,196 B1 | 2/2001 | Kimura et al. |
| 6,201,633 B1 | 3/2001 | Peeters et al. |
| 6,215,221 B1 | 4/2001 | Cabuz et al. |
| 6,232,936 B1 | 5/2001 | Gove et al. |
| 6,239,777 B1 | 5/2001 | Sugahara et al. |
| 6,242,932 B1 | 6/2001 | Hembree |
| 6,243,149 B1 | 6/2001 | Swanson et al. |
| 6,262,697 B1 | 7/2001 | Stephenson |
| 6,282,010 B1 | 8/2001 | Sulzbach et al. |
| 6,285,424 B1 | 9/2001 | Yoshida |
| 6,288,472 B1 | 9/2001 | Cabuz et al. |
| 6,288,824 B1 | 9/2001 | Kastalsky |
| 6,295,154 B1 | 9/2001 | Laor et al. |
| 6,301,000 B1 | 10/2001 | Johnson |
| 6,323,923 B1 | 11/2001 | Hoshino et al. |
| 6,323,982 B1 | 11/2001 | Hornbeck |
| 6,323,987 B1 | 11/2001 | Rinaudo et al. |
| 6,327,071 B1 | 12/2001 | Kimura |
| 6,331,909 B1 | 12/2001 | Dunfield |
| 6,335,235 B1 | 1/2002 | Bhekta et al. |
| 6,335,831 B2 | 1/2002 | Kowarz et al. |
| 6,339,417 B1 | 1/2002 | Quanrud |
| 6,351,329 B1 | 2/2002 | Greywall |
| 6,353,489 B1 | 3/2002 | Popovich et al. |
| 6,356,254 B1 | 3/2002 | Kimura |
| 6,356,378 B1 | 3/2002 | Huibers |
| 6,358,021 B1 | 3/2002 | Cabuz |
| 6,376,787 B1 | 4/2002 | Martin et al. |
| 6,377,233 B2 | 4/2002 | Colgan et al. |
| 6,381,022 B1 | 4/2002 | Zavracky |
| 6,384,952 B1 | 5/2002 | Clark et al. |
| 6,400,738 B1 | 6/2002 | Tucker et al. |
| 6,407,851 B1 | 6/2002 | Islam et al. |
| 6,417,868 B1 | 7/2002 | Bock et al. |
| 6,433,917 B1 | 8/2002 | Mei et al. |

(56) References Cited

U.S. PATENT DOCUMENTS

| | | |
|---|---|---|
| 6,437,583 B1 | 8/2002 | Tartagni et al. |
| 6,438,282 B1 | 8/2002 | Takeda et al. |
| 6,447,126 B1 | 9/2002 | Hornbeck |
| 6,449,084 B1 | 9/2002 | Guo |
| 6,452,712 B2 | 9/2002 | Atobe et al. |
| 6,456,420 B1 | 9/2002 | Goodwin-Johansson |
| 6,465,355 B1 | 10/2002 | Horsley |
| 6,466,190 B1 | 10/2002 | Evoy |
| 6,466,354 B1 | 10/2002 | Gudeman |
| 6,466,358 B2 | 10/2002 | Tew |
| 6,473,072 B1 | 10/2002 | Comiskey et al. |
| 6,473,274 B1 | 10/2002 | Maimone et al. |
| 6,480,177 B2 | 11/2002 | Doherty et al. |
| 6,496,122 B2 | 12/2002 | Sampsell |
| 6,519,073 B1 | 2/2003 | Goossen |
| 6,535,663 B1 | 3/2003 | Chertkow |
| 6,545,335 B1 | 4/2003 | Chua et al. |
| 6,548,908 B2 | 4/2003 | Chua et al. |
| 6,549,338 B1 | 4/2003 | Wolverton et al. |
| 6,552,840 B2 | 4/2003 | Knipe |
| 6,556,338 B2 | 4/2003 | Han et al. |
| 6,574,033 B1 | 6/2003 | Chui et al. |
| 6,589,625 B1 | 7/2003 | Kothari et al. |
| 6,597,490 B2 | 7/2003 | Tayebati |
| 6,600,201 B2 | 7/2003 | Hartwell et al. |
| 6,606,175 B1 | 8/2003 | Sampsell et al. |
| 6,608,268 B1 | 8/2003 | Goldsmith |
| 6,624,944 B1 | 9/2003 | Wallace et al. |
| 6,625,047 B2 | 9/2003 | Coleman, Jr. |
| 6,630,786 B2 | 10/2003 | Cummings et al. |
| 6,632,698 B2 | 10/2003 | Ives |
| 6,635,919 B1 | 10/2003 | Melendez et al. |
| 6,643,069 B2 | 11/2003 | Dewald |
| 6,650,455 B2 | 11/2003 | Miles |
| 6,657,832 B2 | 12/2003 | Williams et al. |
| 6,660,656 B2 | 12/2003 | Cheung et al. |
| 6,661,561 B2 | 12/2003 | Fitzpatrick et al. |
| 6,666,561 B1 | 12/2003 | Blakley |
| 6,674,033 B1 | 1/2004 | Wang |
| 6,674,090 B1 | 1/2004 | Chua et al. |
| 6,674,562 B1 | 1/2004 | Miles et al. |
| 6,680,792 B2 | 1/2004 | Miles |
| 6,698,295 B1 | 3/2004 | Sherrer |
| 6,710,908 B2 | 3/2004 | Miles et al. |
| 6,738,194 B1 | 5/2004 | Ramirez et al. |
| 6,741,377 B2 | 5/2004 | Miles |
| 6,741,383 B2 | 5/2004 | Huibers et al. |
| 6,741,384 B1 | 5/2004 | Martin et al. |
| 6,741,503 B1 | 5/2004 | Farris et al. |
| 6,747,785 B2 | 6/2004 | Chen et al. |
| 6,747,800 B1 | 6/2004 | Lin |
| 6,768,555 B2 | 7/2004 | Chen |
| 6,775,174 B2 | 8/2004 | Huffman et al. |
| 6,778,155 B2 | 8/2004 | Doherty et al. |
| 6,787,438 B1 | 9/2004 | Nelson |
| 6,791,735 B2 | 9/2004 | Stappaerts |
| 6,794,119 B2 | 9/2004 | Miles |
| 6,807,892 B2 | 10/2004 | Biegelsen et al. |
| 6,809,788 B2 | 10/2004 | Yamada et al. |
| 6,811,267 B1 | 11/2004 | Allen et al. |
| 6,813,059 B2 | 11/2004 | Hunter et al. |
| 6,819,469 B1 | 11/2004 | Koba |
| 6,822,628 B2 | 11/2004 | Dunphy et al. |
| 6,822,780 B1 | 11/2004 | Long, Jr. |
| 6,829,132 B2 | 12/2004 | Martin et al. |
| 6,836,366 B1 | 12/2004 | Flanders et al. |
| 6,841,081 B2 | 1/2005 | Chang et al. |
| 6,844,959 B2 | 1/2005 | Huibers et al. |
| 6,849,471 B2 | 2/2005 | Patel et al. |
| 6,853,129 B1 | 2/2005 | Cummings et al. |
| 6,855,610 B2 | 2/2005 | Tung et al. |
| 6,859,218 B1 | 2/2005 | Luman et al. |
| 6,861,277 B1 | 3/2005 | Monroe et al. |
| 6,862,022 B2 | 3/2005 | Slupe |
| 6,862,029 B1 | 3/2005 | D'Souza et al. |
| 6,862,127 B1 | 3/2005 | Ishii |
| 6,867,896 B2 | 3/2005 | Miles |
| 6,870,581 B2 | 3/2005 | Li et al. |
| 6,870,654 B2 | 3/2005 | Lin et al. |
| 6,876,047 B2 | 4/2005 | Cunningham et al. |
| 6,876,482 B2 | 4/2005 | DeReus |
| 6,882,458 B2 | 4/2005 | Lin et al. |
| 6,882,461 B1 | 4/2005 | Tsai et al. |
| 6,891,658 B2 | 5/2005 | Whitehead et al. |
| 6,912,022 B2 | 6/2005 | Lin et al. |
| 6,913,942 B2 | 7/2005 | Patel et al. |
| 6,940,630 B2 | 9/2005 | Xie |
| 6,947,200 B2 | 9/2005 | Huibers |
| 6,952,303 B2 | 10/2005 | Lin et al. |
| 6,958,847 B2 | 10/2005 | Lin |
| 6,959,990 B2 | 11/2005 | Penn |
| 6,960,305 B2 | 11/2005 | Doan et al. |
| 6,980,350 B2 | 12/2005 | Hung et al. |
| 6,982,820 B2 | 1/2006 | Tsai |
| 6,983,135 B1 | 1/2006 | Tsai et al. |
| 6,999,225 B2 | 2/2006 | Lin et al. |
| 7,002,726 B2 | 2/2006 | Patel et al. |
| 7,006,272 B2 | 2/2006 | Tsai |
| 7,008,812 B1 | 3/2006 | Carley |
| 7,009,754 B2 | 3/2006 | Huibers |
| 7,015,624 B1 | 3/2006 | Su et al. |
| 7,027,204 B2 | 4/2006 | Trisnadi et al. |
| 7,034,981 B2 | 4/2006 | Makigaki |
| 7,046,422 B2 | 5/2006 | Kimura et al. |
| 7,053,737 B2 | 5/2006 | Schwartz et al. |
| 7,072,093 B2 | 7/2006 | Piehl et al. |
| 7,075,700 B2 | 7/2006 | Muenter |
| 7,113,339 B2 | 9/2006 | Taguchi et al. |
| 7,119,945 B2 | 10/2006 | Kothari et al. |
| 7,123,216 B1 | 10/2006 | Miles |
| 7,126,738 B2 | 10/2006 | Miles |
| 7,130,104 B2 | 10/2006 | Cummings |
| 7,161,728 B2 | 1/2007 | Sampsell et al. |
| 7,164,522 B2 | 1/2007 | Kimura et al. |
| 7,184,195 B2 | 2/2007 | Yang |
| 7,184,202 B2 | 2/2007 | Miles et al. |
| 7,198,973 B2 | 4/2007 | Lin et al. |
| 7,205,722 B2 | 4/2007 | Koshio et al. |
| 7,221,495 B2 | 5/2007 | Miles et al. |
| 7,235,914 B2 | 6/2007 | Richards et al. |
| 7,236,284 B2 | 6/2007 | Miles |
| 7,245,285 B2 | 7/2007 | Yeh et al. |
| 7,250,930 B2 | 7/2007 | Hoffman et al. |
| 7,289,259 B2 | 10/2007 | Chui et al. |
| 7,302,157 B2 | 11/2007 | Chui |
| 7,304,784 B2 | 12/2007 | Chui et al. |
| 7,321,456 B2 | 1/2008 | Cummings |
| 7,321,457 B2 | 1/2008 | Heald |
| 7,327,510 B2 | 2/2008 | Cummings et al. |
| 7,372,613 B2 | 5/2008 | Chui et al. |
| 7,372,619 B2 | 5/2008 | Miles |
| 7,385,744 B2 | 6/2008 | Kogut et al. |
| 7,385,762 B2 | 6/2008 | Cummings |
| 7,400,488 B2 | 7/2008 | Lynch et al. |
| 7,405,852 B2 | 7/2008 | Brosnihan et al. |
| 7,417,746 B2 | 8/2008 | Lin et al. |
| 7,420,725 B2 | 9/2008 | Kothari |
| 7,436,573 B2 | 10/2008 | Doan et al. |
| 7,459,402 B2 | 12/2008 | Doan et al. |
| 7,460,291 B2 | 12/2008 | Sampsell et al. |
| 7,460,292 B2 | 12/2008 | Chou |
| 7,471,442 B2 | 12/2008 | Sampsell |
| 7,476,327 B2 | 1/2009 | Tung et al. |
| 7,477,440 B1 | 1/2009 | Huang et al. |
| 7,492,503 B2 | 2/2009 | Chui |
| 7,508,566 B2 | 3/2009 | Feenstra et al. |
| 7,515,327 B2 | 4/2009 | Cummings |
| 7,527,995 B2 | 5/2009 | Sampsell |
| 7,527,998 B2 | 5/2009 | Tung et al. |
| 7,532,377 B2 | 5/2009 | Miles |
| 7,532,381 B2 | 5/2009 | Miles |
| 7,532,386 B2 | 5/2009 | Cummings et al. |
| 7,535,621 B2 | 5/2009 | Chiang |
| 7,542,198 B2 | 6/2009 | Kothari |

(56) References Cited

U.S. PATENT DOCUMENTS

| | | |
|---|---|---|
| 7,545,552 B2 | 6/2009 | U'Ren |
| 7,550,810 B2 | 6/2009 | Mignard et al. |
| 7,554,711 B2 | 6/2009 | Miles |
| 7,554,714 B2 | 6/2009 | Chui et al. |
| 7,561,321 B2 | 7/2009 | Heald |
| 7,564,612 B2 | 7/2009 | Chui |
| 7,566,664 B2 | 7/2009 | Yan et al. |
| 7,566,940 B2 | 7/2009 | Sasagawa et al. |
| 7,567,373 B2 | 7/2009 | Chui et al. |
| 7,569,488 B2 | 8/2009 | Rafanan |
| 7,612,933 B2 | 11/2009 | Djordjev |
| 7,629,197 B2 | 12/2009 | Luo et al. |
| 7,630,121 B2 | 12/2009 | Endisch et al. |
| 7,643,199 B2 | 1/2010 | Lan |
| 7,643,202 B2 | 1/2010 | Sasagawa |
| 7,684,106 B2 | 3/2010 | Sampsell |
| 7,715,079 B2 | 5/2010 | Kogut et al. |
| 7,715,085 B2 | 5/2010 | Sasagawa |
| 7,719,747 B2 | 5/2010 | Tung et al. |
| 7,742,220 B2 | 6/2010 | Kogut et al. |
| 7,746,539 B2 | 6/2010 | Sampsell |
| 7,768,690 B2 | 8/2010 | Sampsell |
| 7,773,286 B2 | 8/2010 | Mignard |
| 7,782,517 B2 | 8/2010 | Griffiths et al. |
| 7,782,523 B2 | 8/2010 | Ishii |
| 7,808,695 B2 | 10/2010 | Sampsell |
| 7,813,029 B2 | 10/2010 | Kothari et al. |
| 7,847,999 B2 | 12/2010 | Lee et al. |
| 7,848,003 B2 | 12/2010 | Kothari et al. |
| 7,852,544 B2 | 12/2010 | Sampsell |
| 7,855,826 B2 | 12/2010 | de Groot et al. |
| 7,859,740 B2 | 12/2010 | Tung |
| RE42,119 E | 2/2011 | Chui et al. |
| 7,889,417 B2 | 2/2011 | Sasagawa |
| 7,898,722 B2 | 3/2011 | Miles |
| 7,898,723 B2 | 3/2011 | Khazeni et al. |
| 7,898,725 B2 | 3/2011 | Sampsell |
| 7,911,678 B2 | 3/2011 | Huang |
| 7,944,604 B2 | 5/2011 | Ganti et al. |
| 7,952,787 B2 | 5/2011 | Tung et al. |
| 7,969,638 B2 | 6/2011 | Xu et al. |
| 7,990,604 B2 | 8/2011 | Lee et al. |
| 8,023,167 B2 | 9/2011 | Sampsell |
| 8,053,336 B2 | 11/2011 | Wu et al. |
| 8,054,527 B2 | 11/2011 | Khazeni et al. |
| 8,058,549 B2 | 11/2011 | Kothari et al. |
| 8,081,373 B2 | 12/2011 | Kothari et al. |
| 8,098,417 B2 | 1/2012 | Sasagawa |
| 8,102,590 B2 | 1/2012 | Tung et al. |
| 8,111,262 B2 | 2/2012 | Djordjev et al. |
| 8,115,987 B2 | 2/2012 | Bita et al. |
| 8,164,821 B2 | 4/2012 | Gudlavalleti et al. |
| 2001/0001080 A1 | 5/2001 | Eldridge et al. |
| 2001/0003487 A1 | 6/2001 | Miles |
| 2001/0028503 A1 | 10/2001 | Flanders et al. |
| 2001/0043171 A1 | 11/2001 | Van Gorkom et al. |
| 2001/0055208 A1 | 12/2001 | Kimura |
| 2002/0014579 A1 | 2/2002 | Dunfield |
| 2002/0021485 A1 | 2/2002 | Pilossof |
| 2002/0027636 A1 | 3/2002 | Yamada |
| 2002/0051281 A1 | 5/2002 | Ueda et al. |
| 2002/0054424 A1 | 5/2002 | Miles |
| 2002/0070931 A1 | 6/2002 | Ishikawa |
| 2002/0075555 A1 | 6/2002 | Miles |
| 2002/0114558 A1 | 8/2002 | Nemirovsky |
| 2002/0126364 A1 | 9/2002 | Miles |
| 2002/0139981 A1 | 10/2002 | Young |
| 2002/0146200 A1 | 10/2002 | Kudrle et al. |
| 2002/0149828 A1 | 10/2002 | Miles |
| 2002/0149834 A1* | 10/2002 | Mei et al. ............ 359/295 |
| 2002/0149850 A1 | 10/2002 | Heffner et al. |
| 2002/0154422 A1 | 10/2002 | Sniegowski et al. |
| 2002/0167072 A1 | 11/2002 | Andosca |
| 2002/0167730 A1 | 11/2002 | Needham et al. |
| 2002/0186209 A1 | 12/2002 | Cok |
| 2002/0186483 A1 | 12/2002 | Hagelin et al. |
| 2002/0197761 A1 | 12/2002 | Patel et al. |
| 2003/0011864 A1 | 1/2003 | Flanders |
| 2003/0015936 A1 | 1/2003 | Yoon et al. |
| 2003/0016428 A1 | 1/2003 | Kato et al. |
| 2003/0029705 A1 | 2/2003 | Qiu et al. |
| 2003/0035196 A1 | 2/2003 | Walker |
| 2003/0043157 A1 | 3/2003 | Miles |
| 2003/0053078 A1 | 3/2003 | Missey et al. |
| 2003/0119221 A1 | 6/2003 | Cunningham et al. |
| 2003/0123125 A1 | 7/2003 | Little |
| 2003/0138669 A1 | 7/2003 | Kojima et al. |
| 2003/0156315 A1 | 8/2003 | Li et al. |
| 2003/0173504 A1 | 9/2003 | Cole et al. |
| 2003/0202264 A1 | 10/2003 | Weber et al. |
| 2003/0202265 A1 | 10/2003 | Reboa et al. |
| 2003/0202266 A1 | 10/2003 | Ring et al. |
| 2003/0210851 A1 | 11/2003 | Fu et al. |
| 2004/0008396 A1 | 1/2004 | Stappaerts |
| 2004/0008438 A1 | 1/2004 | Sato |
| 2004/0020192 A1 | 2/2004 | Kimura et al. |
| 2004/0027671 A1 | 2/2004 | Wu et al. |
| 2004/0027701 A1 | 2/2004 | Ishikawa |
| 2004/0043552 A1 | 3/2004 | Strumpell et al. |
| 2004/0051929 A1* | 3/2004 | Sampsell et al. ............ 359/247 |
| 2004/0056742 A1 | 3/2004 | Dabbaj |
| 2004/0058532 A1 | 3/2004 | Miles et al. |
| 2004/0066477 A1 | 4/2004 | Morimoto et al. |
| 2004/0075967 A1 | 4/2004 | Lynch et al. |
| 2004/0076802 A1 | 4/2004 | Tompkin et al. |
| 2004/0080035 A1 | 4/2004 | Delapierre |
| 2004/0100594 A1 | 5/2004 | Huibers et al. |
| 2004/0100677 A1 | 5/2004 | Huibers et al. |
| 2004/0107775 A1 | 6/2004 | Kim |
| 2004/0124483 A1 | 7/2004 | Partridge et al. |
| 2004/0125281 A1 | 7/2004 | Lin et al. |
| 2004/0125282 A1 | 7/2004 | Lin et al. |
| 2004/0125347 A1 | 7/2004 | Patel et al. |
| 2004/0136045 A1 | 7/2004 | Tran |
| 2004/0140557 A1 | 7/2004 | Sun et al. |
| 2004/0145049 A1 | 7/2004 | McKinnell et al. |
| 2004/0145811 A1 | 7/2004 | Lin et al. |
| 2004/0147056 A1 | 7/2004 | McKinnell et al. |
| 2004/0147198 A1 | 7/2004 | Lin et al. |
| 2004/0148009 A1 | 7/2004 | Buzzard et al. |
| 2004/0150939 A1 | 8/2004 | Huff |
| 2004/0160143 A1 | 8/2004 | Shreeve et al. |
| 2004/0174583 A1 | 9/2004 | Chen et al. |
| 2004/0175577 A1 | 9/2004 | Lin et al. |
| 2004/0179281 A1 | 9/2004 | Reboa |
| 2004/0179445 A1 | 9/2004 | Park et al. |
| 2004/0184134 A1 | 9/2004 | Makigaki |
| 2004/0184766 A1 | 9/2004 | Kim et al. |
| 2004/0188599 A1 | 9/2004 | Viktorovitch et al. |
| 2004/0201908 A1 | 10/2004 | Kaneko |
| 2004/0207497 A1 | 10/2004 | Hsu et al. |
| 2004/0207897 A1 | 10/2004 | Lin |
| 2004/0209192 A1 | 10/2004 | Lin et al. |
| 2004/0209195 A1 | 10/2004 | Lin |
| 2004/0212026 A1 | 10/2004 | Van et al. |
| 2004/0217264 A1 | 11/2004 | Wood et al. |
| 2004/0217378 A1 | 11/2004 | Martin et al. |
| 2004/0217919 A1 | 11/2004 | Piehl et al. |
| 2004/0218251 A1 | 11/2004 | Piehl et al. |
| 2004/0218334 A1 | 11/2004 | Martin et al. |
| 2004/0227493 A1 | 11/2004 | Van Brocklin et al. |
| 2004/0233503 A1 | 11/2004 | Kimura |
| 2004/0240032 A1 | 12/2004 | Miles |
| 2004/0240138 A1 | 12/2004 | Martin et al. |
| 2004/0245588 A1 | 12/2004 | Nikkel et al. |
| 2004/0259010 A1 | 12/2004 | Kanbe |
| 2005/0001828 A1 | 1/2005 | Martin et al. |
| 2005/0002082 A1 | 1/2005 | Miles |
| 2005/0003667 A1 | 1/2005 | Lin et al. |
| 2005/0014374 A1 | 1/2005 | Partridge et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0038950 A1 | 2/2005 | Adelmann |

(56) References Cited

U.S. PATENT DOCUMENTS

| | | |
|---|---|---|
| 2005/0042117 A1 | 2/2005 | Lin |
| 2005/0046919 A1 | 3/2005 | Taguchi et al. |
| 2005/0046922 A1 | 3/2005 | Lin et al. |
| 2005/0046948 A1 | 3/2005 | Lin |
| 2005/0057442 A1 | 3/2005 | Way |
| 2005/0068583 A1 | 3/2005 | Gutkowski et al. |
| 2005/0068627 A1 | 3/2005 | Nakamura et al. |
| 2005/0069209 A1 | 3/2005 | Damera-Venkata et al. |
| 2005/0078348 A1 | 4/2005 | Lin |
| 2005/0117190 A1 | 6/2005 | Iwauchi et al. |
| 2005/0117623 A1 | 6/2005 | Shchukin et al. |
| 2005/0122294 A1 | 6/2005 | Ben-David et al. |
| 2005/0128543 A1 | 6/2005 | Phillips et al. |
| 2005/0133761 A1 | 6/2005 | Thielemans |
| 2005/0168849 A1 | 8/2005 | Lin |
| 2005/0179378 A1 | 8/2005 | Oooka et al. |
| 2005/0195462 A1 | 9/2005 | Lin |
| 2005/0236260 A1 | 10/2005 | Pasch et al. |
| 2005/0241394 A1 | 11/2005 | Clark |
| 2005/0275930 A1 | 12/2005 | Patel et al. |
| 2006/0007517 A1 | 1/2006 | Tsai |
| 2006/0017379 A1 | 1/2006 | Su et al. |
| 2006/0017689 A1 | 1/2006 | Faase et al. |
| 2006/0024880 A1 | 2/2006 | Chui et al. |
| 2006/0038643 A1 | 2/2006 | Xu et al. |
| 2006/0044654 A1 | 3/2006 | Vandorpe et al. |
| 2006/0065940 A1 | 3/2006 | Kothari |
| 2006/0066599 A1 | 3/2006 | Chui |
| 2006/0066640 A1 | 3/2006 | Kothari et al. |
| 2006/0066641 A1 | 3/2006 | Gally et al. |
| 2006/0066936 A1 | 3/2006 | Chui et al. |
| 2006/0066937 A1 | 3/2006 | Chui |
| 2006/0066938 A1 | 3/2006 | Chui |
| 2006/0067028 A1 | 3/2006 | Floyd |
| 2006/0067648 A1 | 3/2006 | Chui et al. |
| 2006/0067649 A1 | 3/2006 | Tung et al. |
| 2006/0067651 A1 | 3/2006 | Chui |
| 2006/0077155 A1 | 4/2006 | Chui et al. |
| 2006/0077156 A1 | 4/2006 | Chui et al. |
| 2006/0082588 A1 | 4/2006 | Mizuno et al. |
| 2006/0082863 A1 | 4/2006 | Piehl et al. |
| 2006/0103643 A1 | 5/2006 | Mathew et al. |
| 2006/0132927 A1 | 6/2006 | Yoon |
| 2006/0144681 A1 | 7/2006 | Lee et al. |
| 2006/0171628 A1 | 8/2006 | Naniwada |
| 2006/0180886 A1 | 8/2006 | Tsang |
| 2006/0220160 A1 | 10/2006 | Miles |
| 2006/0262126 A1 | 11/2006 | Miles |
| 2007/0020948 A1 | 1/2007 | Piehl et al. |
| 2007/0029096 A1 | 2/2007 | Zuev et al. |
| 2007/0077525 A1 | 4/2007 | Davis et al. |
| 2007/0086078 A1 | 4/2007 | Hagood et al. |
| 2007/0097694 A1 | 5/2007 | Faase et al. |
| 2007/0121118 A1 | 5/2007 | Gally et al. |
| 2007/0138391 A1 | 6/2007 | Garber et al. |
| 2007/0138608 A1 | 6/2007 | Ikehashi |
| 2007/0153860 A1 | 7/2007 | Chang-Hasnain et al. |
| 2007/0177247 A1 | 8/2007 | Miles |
| 2007/0205969 A1 | 9/2007 | Hagood et al. |
| 2007/0216987 A1 | 9/2007 | Hagood et al. |
| 2007/0247401 A1 | 10/2007 | Sasagawa et al. |
| 2007/0247696 A1 | 10/2007 | Sasagawa et al. |
| 2007/0249081 A1 | 10/2007 | Luo et al. |
| 2007/0253054 A1 | 11/2007 | Miles |
| 2007/0268211 A1 | 11/2007 | Whitehead et al. |
| 2007/0279729 A1 | 12/2007 | Kothari et al. |
| 2007/0279730 A1 | 12/2007 | Heald |
| 2007/0279753 A1 | 12/2007 | Tung et al. |
| 2007/0285761 A1 | 12/2007 | Zhong et al. |
| 2008/0002299 A1 | 1/2008 | Thurn |
| 2008/0013144 A1 | 1/2008 | Chui et al. |
| 2008/0013145 A1 | 1/2008 | Chui et al. |
| 2008/0030657 A1 | 2/2008 | Wu et al. |
| 2008/0037093 A1 | 2/2008 | Miles |
| 2008/0055706 A1 | 3/2008 | Chui et al. |
| 2008/0055707 A1 | 3/2008 | Kogut et al. |
| 2008/0068697 A1 | 3/2008 | Haluzak et al. |
| 2008/0080043 A1 | 4/2008 | Chui et al. |
| 2008/0088904 A1 | 4/2008 | Miles |
| 2008/0088910 A1 | 4/2008 | Miles |
| 2008/0088911 A1 | 4/2008 | Miles |
| 2008/0088912 A1 | 4/2008 | Miles |
| 2008/0106782 A1 | 5/2008 | Miles |
| 2008/0110855 A1 | 5/2008 | Cummings |
| 2008/0112035 A1 | 5/2008 | Cummings |
| 2008/0151353 A1 | 6/2008 | Haskett |
| 2008/0247028 A1 | 10/2008 | Chui et al. |
| 2008/0283374 A1 | 11/2008 | Naito |
| 2008/0297880 A1 | 12/2008 | Steckl et al. |
| 2009/0009444 A1 | 1/2009 | Heald et al. |
| 2009/0021884 A1 | 1/2009 | Nakamura |
| 2009/0068781 A1 | 3/2009 | Tung et al. |
| 2009/0078316 A1 | 3/2009 | Khazeni et al. |
| 2009/0080060 A1 | 3/2009 | Sampsell et al. |
| 2009/0122384 A1 | 5/2009 | Felnhofer et al. |
| 2009/0126777 A1 | 5/2009 | Khazeni et al. |
| 2009/0135465 A1 | 5/2009 | Chui |
| 2009/0159123 A1 | 6/2009 | Kothari et al. |
| 2009/0201566 A1 | 8/2009 | Kothari |
| 2009/0211885 A1 | 8/2009 | Steeneken et al. |
| 2009/0213450 A1 | 8/2009 | Sampsell |
| 2009/0231496 A1 | 9/2009 | Nishino et al. |
| 2009/0256218 A1 | 10/2009 | Mignard et al. |
| 2009/0279162 A1 | 11/2009 | Chui |
| 2009/0293955 A1 | 12/2009 | Kothari et al. |
| 2010/0014148 A1 | 1/2010 | Djordjev |
| 2010/0039370 A1 | 2/2010 | Miles |
| 2010/0051089 A1 | 3/2010 | Khazeni et al. |
| 2010/0053148 A1 | 3/2010 | Khazeni et al. |
| 2010/0080890 A1 | 4/2010 | Tung et al. |
| 2010/0085626 A1 | 4/2010 | Tung et al. |
| 2010/0096006 A1 | 4/2010 | Griffiths et al. |
| 2010/0096011 A1 | 4/2010 | Griffiths et al. |
| 2010/0118382 A1 | 5/2010 | Kothari et al. |
| 2010/0236624 A1 | 9/2010 | Khazeni et al. |
| 2010/0238572 A1 | 9/2010 | Tao et al. |
| 2010/0264423 A1 | 10/2010 | Wood et al. |
| 2010/0309572 A1 | 12/2010 | Mignard |
| 2011/0019380 A1 | 1/2011 | Miles |
| 2011/0026096 A1 | 2/2011 | Miles |
| 2011/0038027 A1 | 2/2011 | Miles |
| 2011/0044496 A1 | 2/2011 | Chui et al. |
| 2011/0063712 A1 | 3/2011 | Kothari et al. |
| 2011/0069371 A1 | 3/2011 | Kothari et al. |
| 2011/0075241 A1 | 3/2011 | Mienko et al. |
| 2011/0075245 A1 | 3/2011 | Hashimura et al. |
| 2011/0080632 A1 | 4/2011 | Miles |
| 2011/0090554 A1 | 4/2011 | Tung |
| 2011/0116156 A1 | 5/2011 | Kothari |
| 2011/0169724 A1 | 7/2011 | Tao et al. |
| 2011/0170166 A1 | 7/2011 | Miles |
| 2011/0170167 A1 | 7/2011 | Miles |
| 2011/0170168 A1 | 7/2011 | Endisch et al. |
| 2011/0188109 A1 | 8/2011 | Chui et al. |
| 2011/0188110 A1 | 8/2011 | Miles |
| 2011/0194169 A1 | 8/2011 | Ganti et al. |
| 2011/0235155 A1 | 9/2011 | Tao et al. |
| 2012/0194496 A1 | 8/2012 | Zhong et al. |

FOREIGN PATENT DOCUMENTS

| | | |
|---|---|---|
| DE | 10228946 A1 | 1/2004 |
| DE | 102006039071 A1 | 2/2008 |
| EP | 0 071 287 | 2/1983 |
| EP | 0 035 299 | 9/1983 |
| EP | 0310176 A2 | 4/1989 |
| EP | 0 332 953 | 9/1989 |
| EP | 0361981 A2 | 4/1990 |
| EP | 0 668 490 | 8/1995 |
| EP | 0667548 A1 | 8/1995 |
| EP | 0 695 959 | 2/1996 |
| EP | 0788005 A2 | 8/1997 |
| EP | 0 879 991 | 11/1998 |
| EP | 0 969 306 | 1/2000 |

(56) References Cited

FOREIGN PATENT DOCUMENTS

| EP | 0 986 077 | 3/2000 |
|---|---|---|
| EP | 1 122 577 | 8/2001 |
| EP | 1 146 533 | 10/2001 |
| EP | 1 172 681 | 1/2002 |
| EP | 1 205 782 | 5/2002 |
| EP | 1 227 346 | 7/2002 |
| EP | 1 275 997 | 1/2003 |
| EP | 1 403 212 | 3/2004 |
| EP | 1435336 A2 | 7/2004 |
| EP | 1439515 A2 | 7/2004 |
| EP | 1443017 A2 | 8/2004 |
| EP | 1 473 581 | 11/2004 |
| EP | 1473691 A2 | 11/2004 |
| EP | 1484635 A1 | 12/2004 |
| EP | 1 802 114 | 6/2007 |
| EP | 1928028 A1 | 6/2008 |
| FR | 2824643 A1 | 11/2002 |
| FR | 2 843 230 | 2/2004 |
| JP | 56-088111 | 7/1981 |
| JP | 62082454 | 4/1987 |
| JP | 4-009625 | 1/1992 |
| JP | 5-49238 | 2/1993 |
| JP | 5-281479 | 10/1993 |
| JP | 5275401 A | 10/1993 |
| JP | 08-051230 | 2/1996 |
| JP | 8-292382 | 11/1996 |
| JP | 9018020 A | 1/1997 |
| JP | 9127439 | 5/1997 |
| JP | 11211999 | 8/1999 |
| JP | 2002-062490 | 2/2000 |
| JP | 2000 147262 | 5/2000 |
| JP | 2000306515 A | 11/2000 |
| JP | 2000348593 A | 12/2000 |
| JP | 2001-221913 | 8/2001 |
| JP | 2001 249283 | 9/2001 |
| JP | 2002-221678 | 8/2002 |
| JP | 2002277771 A | 9/2002 |
| JP | 2002 287047 | 10/2002 |
| JP | 2003-340795 | 2/2003 |
| JP | 2003 177336 | 6/2003 |
| JP | 2003195201 A | 7/2003 |
| JP | 2003315732 A | 11/2003 |
| JP | 2004-012642 | 1/2004 |
| JP | 2004157527 A | 6/2004 |
| JP | 2004-212638 | 7/2004 |
| JP | 2004-212680 | 7/2004 |
| JP | 2004235465 | 8/2004 |
| JP | 2004286825 A | 10/2004 |
| JP | 2005-157133 | 6/2005 |
| JP | 2005-234515 | 9/2005 |
| JP | 2005 279831 | 10/2005 |
| JP | 2005-308871 | 11/2005 |
| JP | 2006055991 A | 3/2006 |
| JP | 2007 027150 | 2/2007 |
| JP | 2007521509 A | 8/2007 |
| JP | 2008517304 A | 5/2008 |
| KR | 20020010322 | 2/2002 |
| RU | 2180158 C2 | 2/2002 |
| TV | V-157313 | 5/1991 |
| WO | WO 91/05284 | 4/1991 |
| WO | WO 95/03562 | 2/1995 |
| WO | WO 98/14804 | 4/1998 |
| WO | WO 98/43129 | 10/1998 |
| WO | WO 98/52224 | 11/1998 |
| WO | WO 01/53113 | 7/2001 |
| WO | WO 02/024570 | 3/2002 |
| WO | WO 02/063682 | 8/2002 |
| WO | WO-02063602 A1 | 8/2002 |
| WO | WO-02071132 A2 | 9/2002 |
| WO | WO 02/079853 | 10/2002 |
| WO | WO 02/086582 | 10/2002 |
| WO | WO-03014789 A2 | 2/2003 |
| WO | WO 03/041133 | 5/2003 |
| WO | WO-03054925 A2 | 7/2003 |
| WO | WO-03069404 A1 | 8/2003 |
| WO | WO 03/079384 | 9/2003 |
| WO | WO-03085728 A1 | 10/2003 |
| WO | WO 03/105198 | 12/2003 |
| WO | WO-2004042687 A2 | 5/2004 |
| WO | WO 2005/006364 A1 | 1/2005 |
| WO | WO 2005/010566 | 2/2005 |
| WO | WO 2005/019899 | 3/2005 |
| WO | WO 2006/035698 | 4/2006 |
| WO | WO 2006/036384 | 4/2006 |
| WO | WO-2006036542 A1 | 4/2006 |
| WO | WO 2007/036422 | 4/2007 |
| WO | WO 2007/045875 | 4/2007 |
| WO | WO 2007/053438 | 5/2007 |
| WO | WO 2007/072998 | 6/2007 |
| WO | WO-2008062363 A2 | 5/2008 |

OTHER PUBLICATIONS

Office Action dated Feb. 2, 2012 in Chinese App. No. 200780024852.2.
Office Action dated Jul. 26, 2012 in Chinese App. No. 200780024852.2.
Official Communication dated Jun. 5, 2012 in European patent application No. 07794971.7.
Extended European Search Report dated Jul. 25, 2012 in application No. 08153354.9.
Extended European Search Report dated Jul. 25, 2012 in application No. 08153355.6.
Notification on Patentability Examination dated May 28, 2012 in Russian application No. 2008151142/28(067187).
Billard, Tunable Capacitor, 5th Annual Review of LETI, Jun. 24, 2003, p. 7.
Bouchaud et al., Sep. 2003, RF MEMES analysis, forecasts and technology review, Chip Unasix, pp. 26-29 [online] retrieved from the internet: ,URL:http//semiconductors.unaxis.com/en/download/RF%20MEMS.pdf>.
Brosnihan et al., Jun. 2003, Optical IMEMS—a fabrication process for MEMS optical switches with integrated on-chip electronic, Transducers, Solid-State Sensors, Actuators and Microsystems, 12th International Conference 2003, 2(8-12):1638-1642.
Cacharelis et al., 1997, A Reflective-mode PDLC Light Valve Display Technology, Proceedings of European Solid State Device Research Conference (ESSDERC), pp. 596-599.
Chan et al., Oct. 2003, Low-actuation voltage RF MEMS shunt switch with cold switching lifetime of seven billion cycles, Journal of Microelectromechanical Systems, 12(5).
Conner, "Hybrid Color Display Using Optical Interference Filter Array," SID Digest, pp. 577-580 (1993).
Dokmeci et al., Dec. 2004, Two-axis single-crystal silicon micromirror arrays, Journal of Microelectromechanical Systems, 13(6):1006-1017.
Farooqui et al., A polysilicon-diaphragm-based pressure sensor technology, Journal of Physics E. Scientific Instruments, 20(12):1469-1471, Dec. 1, 1987.
Farooqui et al., Polysilicon microstructures, Proceedings of the Workshop on Micro Electro Mechanical Systems. Investigation of Micro Structures, Sensors, Actuators, Machines and Robots, Jan. 30, 1991, pp. 187-191.
Feenstra et al., Electrowetting displays, Liquivista BV, 16 pp., Jan. 2006.
Goldsmith et al., Aug. 1998, Performance of low-loss rf mems capacitive switches, IEEE Microwave and Guided Wave Letters, 8(8):269-271.
Hohlfeld et al., Jun. 2003, Micro-machined tunable optical filters with optimized band-pass spectrum, 12th International Conference on Transducers, Solid-State Sensors, Actuators and Microsystems, 2:1494-1497.
IPRP for PCT/US07/011812, filed May 16, 2007.
ISR and WO for PCT/US07/011812, filed May 16, 2007.
Jerman et al., "A Miniature Fabry-Perot Interferometer with a Corrugated Silicon Diaphragm Support", (1988).
Jerman et al., "Miniature Fabry-Perot Interferometers Micromachined in Silicon for Use in Optical Fiber WDM Systems,"

(56) References Cited

OTHER PUBLICATIONS

Transducers, San Francisco, Jun. 24-27, 1991, Proceedings on the Int'l. Conf. on Solid State Sensors and Actuators, vol. Conf. 6, Jun. 24, 1991, pp. 372-375.
Kowarz et al., Conformal grating electromechanical system (GEMS) for high-speed digital light modulation, Proceedings of the IEEEE 15th. Annual International Conference on Micro Electro Mechanical Systems, MEMS 2002, pp. 568-573.
Li et al., Dec. 2006, CMOS micromachine capacitive cantilevers for mass sensing, Journal of Micromechanics and Microengineering, 16(12).
Li, 1999, On the design and fabrication of electrostatic RF MEMS switches, Final Report 1999-00 for MICRO Project 99-071, University of California, Irvine.
Longhurst, 1963, Chapter IX: Multiple Beam Interferometry, in Geometrical and Physical Optics, pp. 153-157.
Maier et al., 1996, 1.3" active matrix liquid crystal spatial light modulator with 508 dpi resolution, SPIE vol. 2754, pp. 171-179.
Mait, Nov. 15-18, 1993, Design of diffractive optical elements for optical signal processing, IEEE Lasers and Electro-Optics Society Annual Meeting, pp. 59-60.
Mehregany et al., 1996, MEMS applications in optical systems, IEEE/LEOS 1996 Summer Topical Meetings, pp. 75-76.
Miles et al, Oct. 21, 1997, A MEMS based interferometric modulator (IMOD) for display applications, Proceedings of Sensors Expo, pp. 281-284.
Miles, A New Reflective FPD Technology Using Interferometric Modulation, Journal of the SID, 5/4, 1997.
Miles, Interferometric modulation: MOEMS as an enabling technology for high performance reflective displays, Proceedings of SPIE, vol. 4985, pp. 131-139, 2003.
Nakagawa et al., Feb. 1, 2002, Wide-field-of-view narrow-band spectral filters based on photonic crystal nanocavities, Optics Letters, 27(3):191-193.
Nieminen et al., 2004, Design of a temperature-stable RF MEM capacitor, IEEE Journal of Microelectromechanical Systems, 13(5):705-714.
Notice of Reasons for Rejection dated Feb. 15, 2011 in Japanese App. No. 2009-518119.
Office Action dated Aug. 5, 2010 in U.S. Appl. No. 12/436,064.
Office Action dated Feb. 12, 2011 in Chinese App. No. 200780024852.2.
Office Action dated May 20, 2008 in U.S. Appl. No. 11/478,702.
Official Action (Inquiry) dated May 27, 2011 in Russian App. No. 2008151142/28(067187).
Pacheco et al., 2000, Design of low actuation voltage RF MEMS switch, Radiation Laboratory and Center for Microsystems Department of Electrical Engineering and Computer Science, University of Michigan, IEEE.
Panitz et al., Electrostatic actuated interference filters as optical switches for projection display applications, The 12th International Conference on Solid state Sensors, Actuators and Microsystems, Jun. 8-12, 2003, pp. 580-582.
Pape et al., Characteristics of the deformable mirror device for optical information processing, Optical Engineering, 22(6):676-681, Nov.-Dec. 1983.
Solgaard et al., Feb. 23-27, 2004, Interference-based optical MEMS filters, Optical 2004 Fiber Communication Conference, vol. 1.
Taii et al., "A transparent sheet display by plastic MEMS," Journal of the SID 14(8):735-741, 2006.
Tan et al., 2003, RF MEMS simulation-high isolation CPW shunt switches, Ansoft: Global Seminars: Delivering Performance.
Tolansky, 1948, Chapter II: Multiple-Beam Interference, in Multiple-bean Interferometry of Surfaces and Films, Oxford at the Clarendon Press, pp. 8-11.
Wang et al., "Flexible Circuit-Based RF MEMS Switches," Proceedings of 2001 ASME International Mechanical Engineering Congress and Exposition, pp. 757-762, Nov. 11-16, 2001.
Wang, Jun. 29-Jul. 1, 2002, Design and fabrication of a novel two-dimension MEMS-based tuneable capacitor, IEEE 2002 International Conference on Communications, Circuits and Systems and West Sino Expositions, 2:1766-1769.
Office Action dated Mar. 5, 2010 in U.S. Appl. No. 12/436,059.
Office Action dated Sep. 17, 2010 in U.S. Appl. No. 12/436,059.
Office Action dated Feb. 4, 2011 in U.S. Appl. No. 12/436,059.
Office Action dated Jun. 9, 2011 in U.S. Appl. No. 12/436,059.
Official Action (Inquiry) dated Nov. 25, 2011 in Russian App. No. 2008151142/28(067187).
Akasaka Y., "Three-Dimensional IC Trends," Proceedings of IEEE, 1986, vol. 74 (12), pp. 1703-1714.
Aratani K, et al., "Process and Design Considerations for Surface Micromachined Beams for a Tuneable Interferometer Array in Silicon," Proc. IEEE Microelectromechanical workshop fort Lauderdale FL, 1993, 230-235.
Aratani K. et al., "Surface Micromachined Tuneable Interferometer Array," Sensors and Actuators A, Elsevier Sequoia S.A., Lausanne, CH, A, 1993, 43(1/3), 17-23.
Austrian Search Report for Ex144/2005 dated Aug. 11, 2005.
Austrian Search Report No. 140/2005, dated Jul. 15, 2005.
Austrian Search Report No. 150/2005, dated Jul. 29, 2005.
Austrian Search Report No. 161/2005, dated Jul. 15, 2005.
Austrian Search Report No. 162/2005, dated Jul. 14, 2005.
Austrian Search Report No. 164/2005, dated Jul. 4, 2005.
Austrian Search Report No. 66/2005 Dated May 9 2005.
Bass, M., et al., Handbook of Optics vol. I: Fundamentals, Techniques, and Design. Second Edition, McGraw-Hill, Inc., New York, 1995, pp. 2.29-2.36.
Butler, et al., "An Embedded Overlay Concept for Microsystems Packaging," IEEE Transactions on Advanced Packaging IEEE, 2000, vol. 23(4), 617-622.
Chiou, et al., "A Novel Capacitance Control Design of Tunable Capacitor using Multiple Electrostatic Driving Electrodes," IEEE Nanoelectronics and Giga-Scale Systems , 2001, 319-324.
Fan, et al., "Channel Drop Filters in Photonic Crystals," Optics Express, 1998, vol. 3(1), pp. 4-11.
Fork, et al., "P-67 Chip on Glass Bonding using Stressed Metal TM Technology," SID 05 Digest, 2005, 534-537.
Giles, et al., "A Silicon Mems Optical Switch Attenuator And its Use in Lightwave Subsystems," IEEE Journal of Selected Topics in Quantum Electronics, 1999, 5 (1), 18-25.
Goossen, et al., "Silicon Modulator Based On Mechnically-Active Anti-Reflection Layer With 1Mbit/Sec Capability for Fiber-In-The-Loop Applications," IEEE Photonics Technology Letters, 1994, 1119-1121.
Goossen K.W. et al., "Possible Display Applications Of The Silicon Mechanical Antireflection Switch," Society for Information Display, 1994.
Goossen K.W., "MEMS-Based Variable Optical Interference Devices," IEEE/Lens International Conference on Optical Mems, Conference Digest, Piscataway, NJ, USA, IEEE Aug. 21, 2000, pp. 17-18.
Gosch, "West Germany Grabs the Lead in X-Ray Lithography," Electronics, 1987, 78-80.
Han, et al., "Color Display using Micromechanically Coupled Mirrors," Applied Physics Letters 97, 251105 (2010), 3 pages.
Heuer A.H., "LPCVD Polysilicon Films with Controlled Curvature for Optical MEMS: the MultiPoly Process", 2000 IEEE/LEOS International Conference on Optical on MEMS (CAT.NO. 00EX399), Jan. 1, 2000, pp. 117-118.
Howard, et al., "Nanometer-Scale Fabrication Techniques," VLSI Electronics: Microstructure Science, 1982, vol. 5, 145-153, 166-173.
Ibbotson, et al., "Comparison of $XeF_2$ and F-atom Reactions with Si and $SiO_2$," Applied Physics Letters, 1984, 44(12), 1129-1131.
Jackson, "Classical Electrodynamics," John Wiley & Sons Inc, 1962, pp. 568-573.
Joannopoulos, et al., "Photonic Crystals Molding the Flow of Light," Princeton University Press, 1995.
Johnson, "Optical Scanners," Microwave Scanning Antennas, 1964, vol. 1(2), 251-261.

(56) References Cited

OTHER PUBLICATIONS

Kim, et al., "Control of Optical Transmission Through Metals Perforated With Subwave-Length Hole Arrays," Optic Letters, 1999, vol. 24(4), 256-258.
Lezec, "Submicrometer Dimple Array Based Interference Color Field Displays and Sensors," Nano Letters, 2006, 7(2), 329-333.
Light Over Matter Circle No. 36, Jun. 1993.
Lin, et al., "Free-Space Micromachined Optical Switches for Optical NetWorking," IEEE Journal of Selected Topics in Quantum Electronics, 1999, vol. 5(1), 4-9.
Little, et al., "Vertically Coupled Microring Resonator Channel Dropping Filter," IEEE Photonics Technology Letters, 1999, 11(2), 215-217.
Londergan, et al., "Advanced processes for MEMS-based displays," Proceedings of the Asia Display, 2007, SID, 1, 107-112.
Magel G.A., "Integrated Optic Devices using Micromachined Metal Membranes," SPIE, 1996, vol. 2686, 54-63.
Nagami, et al., "Plastic Cell Architecture: Towards Reconfigurable Computing for General-Purpose, 0/8186-8900," IEEE, 1998, 68-77.
Newsbreaks, "Quantum-trench devices might operated at terahertz frequencies", Laser Focus World, May 1993.
Oliner, "Radiating Elements and Mutual Coupling," Microwave Scanning Antennas, 1966, vol. 2, 131-157 and pp. 190-194.
Peerlings et al., "Long Resonator Micromachined Tunable GaAs-A1As Fabry-Perot Filter," IEEE Photonics Technology Letters, IEEE Service Center, 1997, vol. 9(9), 1235-1237.
Qualcomm MEMS Technologies, Inc., May 2008, Interferometric Modulator (IMOD), Technology Overview, White Paper, 14 pp.
Raley, et al., ."A Fabry-Perot Microinterferometer for Visible Wavelengths," IEEE Solid-State Sensor and Actuator Workshop, 1992, 170-173.
Schnakenberg, et al., "TNAHW Etchants for Silicon Micromachining," International Conference on Solid State Sensors and Actuators-Digest of Technical Papers, 1991, 815-818.
Science and Technology, The Economist, pp. 89-90, (May 1999).
Sperger, et al., "High Performance Patterned All-Dielectric Interference Colour Filter for Display Applications," SID Digest, 1994, 81-83.
Stone J.M., "Radiation and Optics, An Introduction to the Classic Theory," 1963, McGraw-Hill, pp. 340-343.
Taiwan Search Report—TW096119029—TIPO—May 23, 2013.
Temple-Boyer P., et al., "Properties of SiOxNy films deposited by LPCVD from SiH4/N2O/NH3 gaseous mixture", Sensors and Actuators A, Elsevier Sequoia S.A., Lausanne, CH, vol. 74, No. 1-3, Apr. 20, 1999, pp. 52-55.
U.S. Appl. No. 08/554,630, filed on Nov. 6,1995 by Miles, Mark W.
Walker, et al., "Electron-Beam-Tunable Interference Filter Spatial Light Modulator," Optics Letters, 1988, vol. 13(5), 345-347.
Williams, et al., "Etch Rates for Micromachining Processing," Journal of Microelectromechanical Systems, 1996, vol. 5(4), 256-269.
Winters, et al., "The Etching of Silicon with XeF2 Vapor," Applied Physics Letters, 1979, vol. 34(1), 70-73.
Winton et al., "A novel way to capture solar energy," Chemical Week, pp. 17-18 (May 15, 1985).
Wu, et al., "Design of a Reflective Color LCD using Optical Interference Reflectors," Asia Display, Changchun Institute of Physics, 1995, 929-931.
Wu, et al., "MEMS Designed for Tunable Capacitors," Microwave Symposium Digest, IEEE MTT-S Int'l, 1998, vol. 1, 127-129.
Zhou et al., "Waveguide Panel Display Using Electromechanism Spatial Modulators," SID Digest, 1998, vol. XXIX.

* cited by examiner

|  | Column Output Signals | |
|---|---|---|
|  | $+V_{bias}$ | $-V_{bias}$ |
| Row Output Signals   0 | Stable | Stable |
| $+\Delta V$ | Relax | Actuate |
| $-\Delta V$ | Actuate | Relax |

METHOD OF MANUFACTURING MEMS DEVICES PROVIDING AIR GAP CONTROL

RELATED APPLICATIONS

This application is a continuation of U.S. application Ser. No. 12/436,059, filed May 5, 2009, now U.S. Pat. No. 8,102,590, which is a divisional application of U.S. application Ser. No. 11/478,702, filed Jun. 30, 2006, now U.S. Pat. No. 7,527,998, each of which is hereby incorporated by reference in its entirety.

BACKGROUND OF THE INVENTION

1. Field of the Invention

This invention relates to microelectromechanical systems for use as interferometric modulators. More particularly, this invention relates to improved methods of manufacturing microelectromechanical system devices having different sized cavities between a movable element and a substrate.

2. Description of the Related Art

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

An embodiment provides for a method of making at least two types of microelecromechanical systems (MEMS) devices, the at least two types of MEMS devices having different release states after removal of sacrificial material, the method including providing a substrate, forming a first electrically conductive layer over at least a portion of the substrate, forming a first sacrificial layer over at least a portion of the first conductive layer, forming a plurality of electrically conductive moveable elements over the first sacrificial layer and forming a plurality of flexure controllers over the substrate configured so as to operably support the electrically conductive moveable elements when the sacrificial layer is removed, and where the first sacrificial layer is removable to thereby release the MEMS devices and form cavities having at least two gap sizes between the first electrically conductive layer and the movable elements.

Another embodiment provides a method of making at least two types of interferometric modulators, the at least two types of interferometric modulators having different cavity depths after removal of a sacrificial material, the method including providing a substrate, forming an optical stack over at least a portion of the substrate, forming a first sacrificial material over at least a portion of the optical stack, wherein the sacrificial material is removable to thereby form cavities, forming a second electrically conductive layer over portions of the first sacrificial material, and forming at least two types of flexure controllers over the substrate, the flexure controllers configured so as to operably support the second electrically conductive layer, wherein the at least two types of flexure controllers comprise different sized components, the different sized components configured to form cavities of different depths under the portions of the second electrically conductive layer after removal of the first sacrificial layer.

Another embodiment provides a microelecromechanical system (MEMS) device including a substrate, a plurality of moveable elements over the substrate, each moveable element separated from the substrate by a cavity, and a plurality of flexure controllers over the substrate configured so as to operably support the moveable elements, wherein the plurality of flexure controllers comprise portions of different dimensions to control selected flexures. The selected flexures serve to form the cavities having at least two gap sizes between the substrate and the plurality of movable elements.

Another embodiment provides a method of controlling a depth of a cavity between two layers of a device that includes one or more thin film layers, the method including providing a substrate, forming a sacrificial layer over at least a portion of the substrate, forming a first layer over at least a portion of the sacrificial layer, and forming one or more flexure controllers over the substrate, the flexure controllers configured so as to operably support the first layer and to form cavities, upon removal of the sacrificial layer, of a depth about 30% greater or more than the depth of the sacrificial layer, wherein the depth is measured perpendicular to the substrate.

Another embodiment provides an unreleased microelecromechanical system (MEMS) device that includes a substrate, a sacrificial layer over at least a portion of the substrate, a moveable element over the first sacrificial layer, and one or more flexure controllers over the substrate configured so as to operably support the moveable element and to form a cavity between the substrate and the movable element, upon removal of the sacrificial layer, of a depth about 30 percent greater or more than the depth of the sacrificial layer, wherein the depth is measured perpendicular to the substrate, the sacrificial layer being removable by etching.

Another embodiment provides a method of controlling a depth of a cavity between two layers of a device comprising one or more thin film layers, the method including providing a substrate, forming a sacrificial layer over at least a portion of the substrate, the sacrificial layer being removable by etching, forming a first thin film layer over at least a portion of the sacrificial layer, and forming one or more flexure controllers over the substrate, the flexure controllers configured so as to operably support the first thin film layer and to displace the thin film layer towards the substrate, upon removal of the sacrificial layer.

Another embodiment provides an unreleased microelecromechanical system (MEMS) device, that includes a substrate, a sacrificial layer over at least a portion of the substrate, a moveable element over the first sacrificial layer and one or more flexure controllers over the substrate configured so as to operably support the moveable element and to displace the movable element towards the substrate, upon removal of the sacrificial layer, the sacrificial layer being removable by etching.

DETAILED DESCRIPTION OF THE PREFERRED EMBODIMENT

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

An embodiment provides methods of making MEMS devices with a plurality of flexure controllers over a substrate. The flexure controllers are configured so as to operably support electrically conductive moveable elements and to provide a plurality of selected flexures when a sacrificial layer is removed. The sacrificial layer is removable to thereby release the MEMS devices and form cavities having at least two gap sizes. The flexure controllers can effectuate increases in gap sizes as well as decreases in gap sizes. As a result, multiple depositions, masking and etching steps may be replaced by fewer deposition, masking and etching steps, thus saving time and money in the manufacture of MEMS devices.

Figure 1:
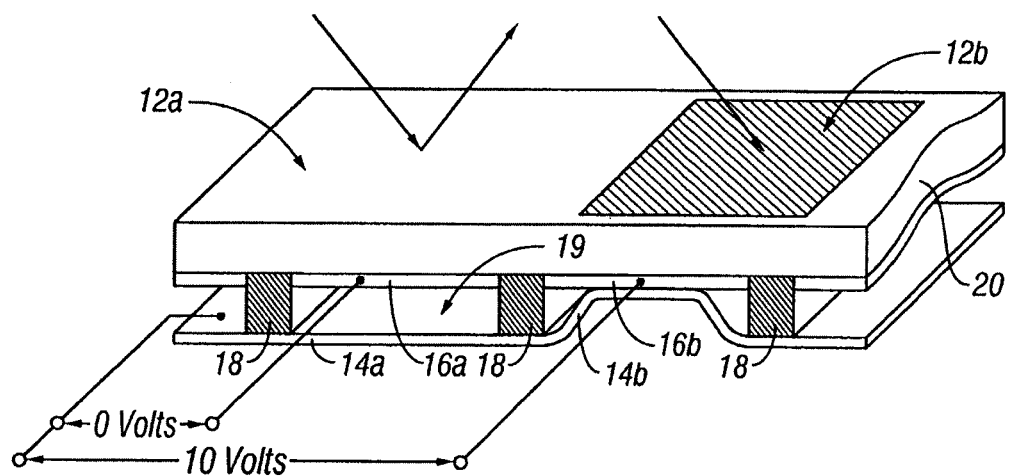
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
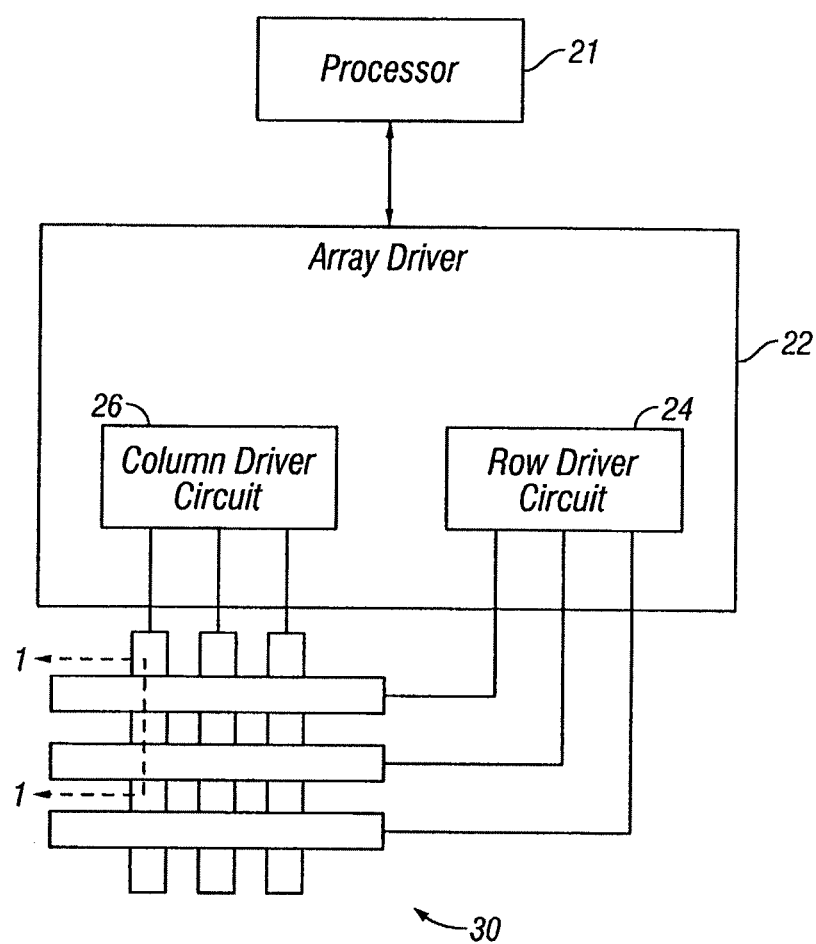
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
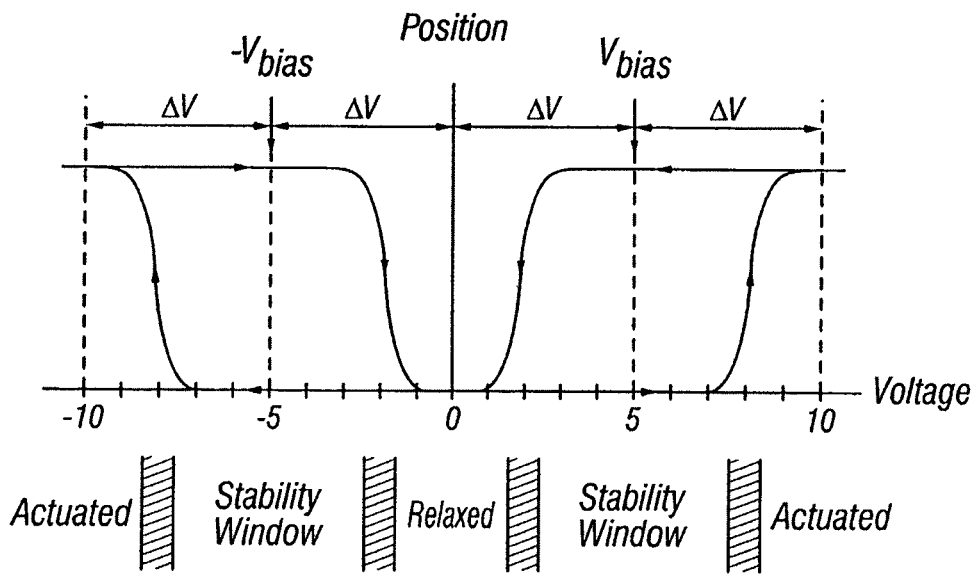
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
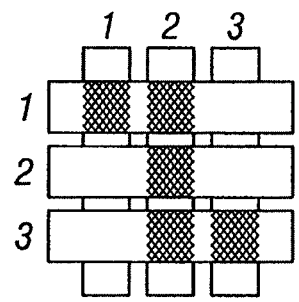
FIG. 5A illustrates one exemplary frame of display data in the 3×3 interferometric modulator display of FIG. 2.
Figure 5B:
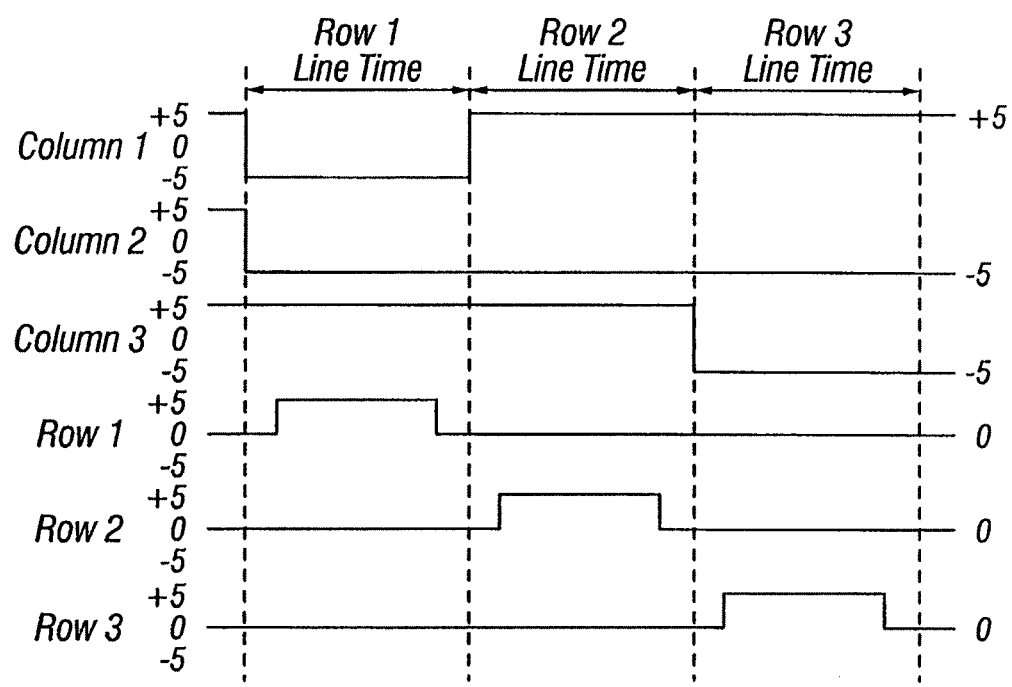
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively. Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
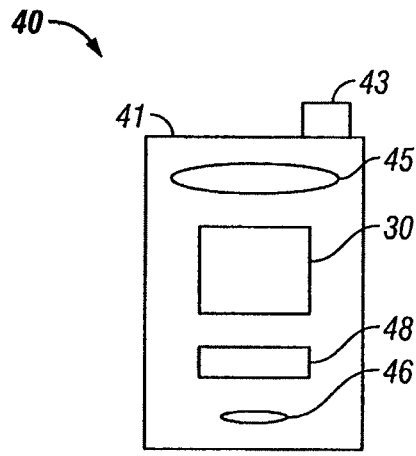
FIGS. 6A and 6B are system block diagrams illustrating an embodiment of a visual display device comprising a plurality of interferometric modulators.
Figure 6B:
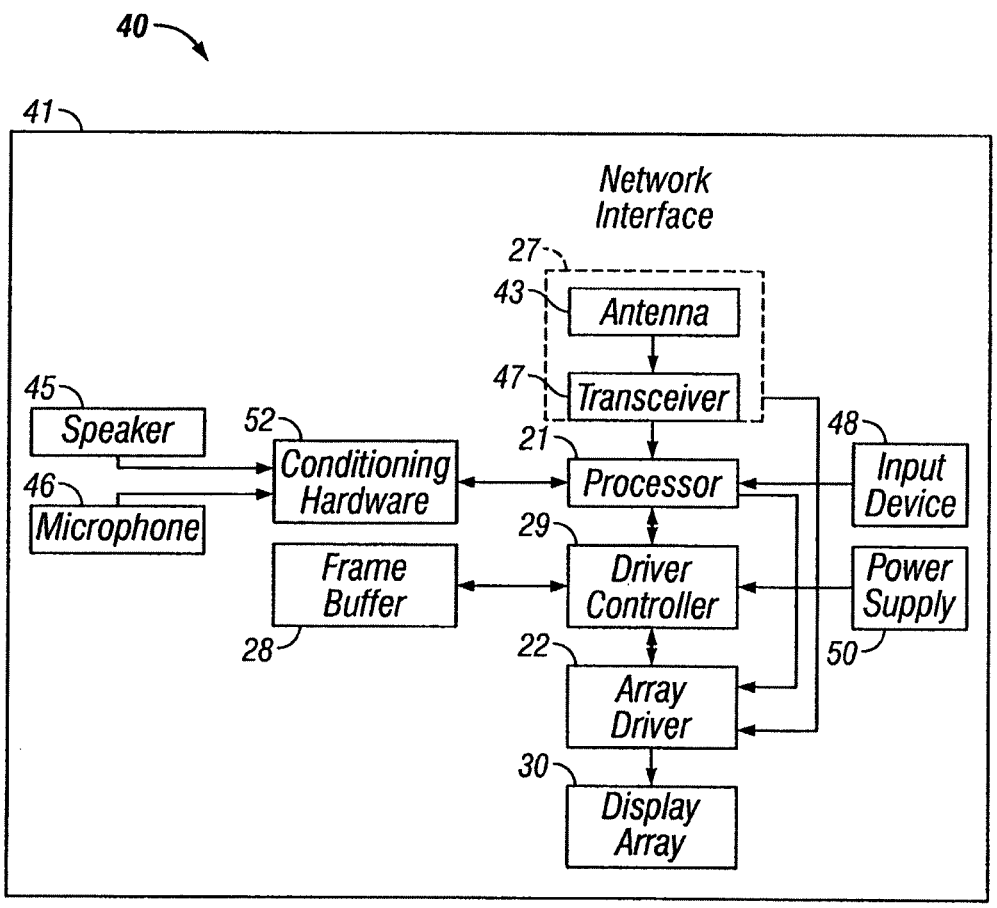

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a memory device such as a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
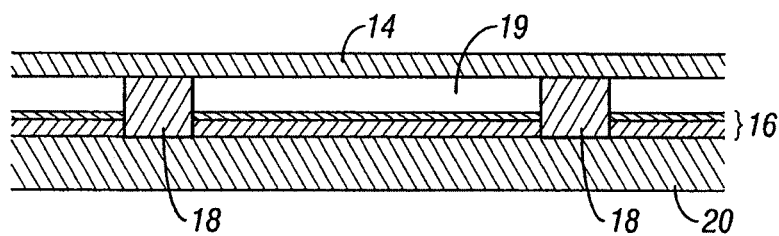
FIG. 7A is a cross section of the device of FIG. 1.
Figure 7B:
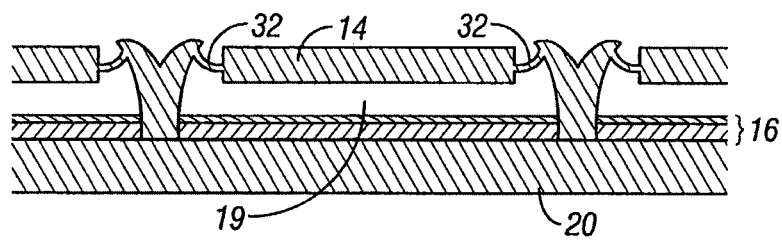
FIG. 7B is a cross section of an alternative embodiment of an interferometric modulator.
Figure 7C:
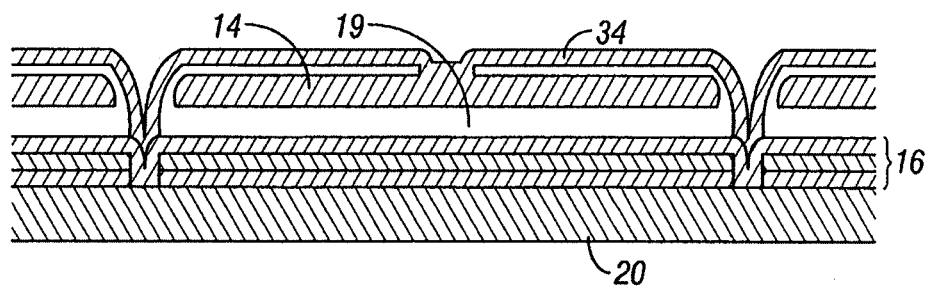
FIG. 7C is a cross section of another alternative embodiment of an interferometric modulator.
Figure 7D:
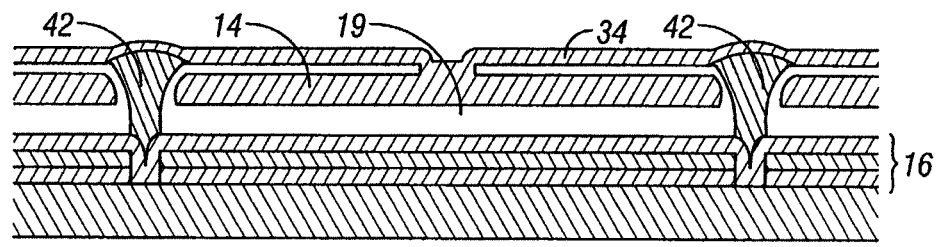
FIG. 7D is a cross section of yet another alternative embodiment of an interferometric modulator.
Figure 7E:
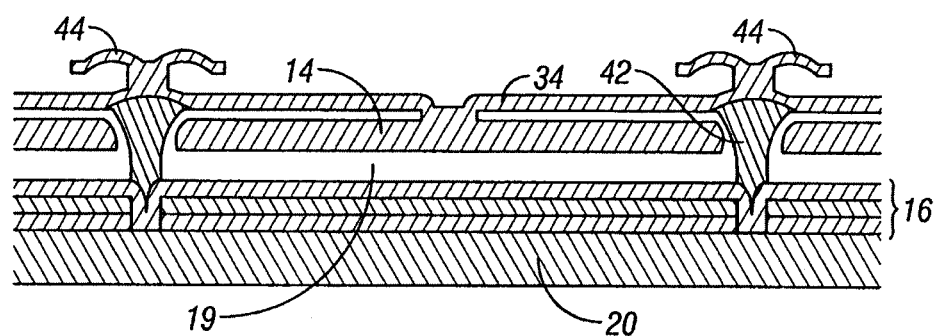
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 8:
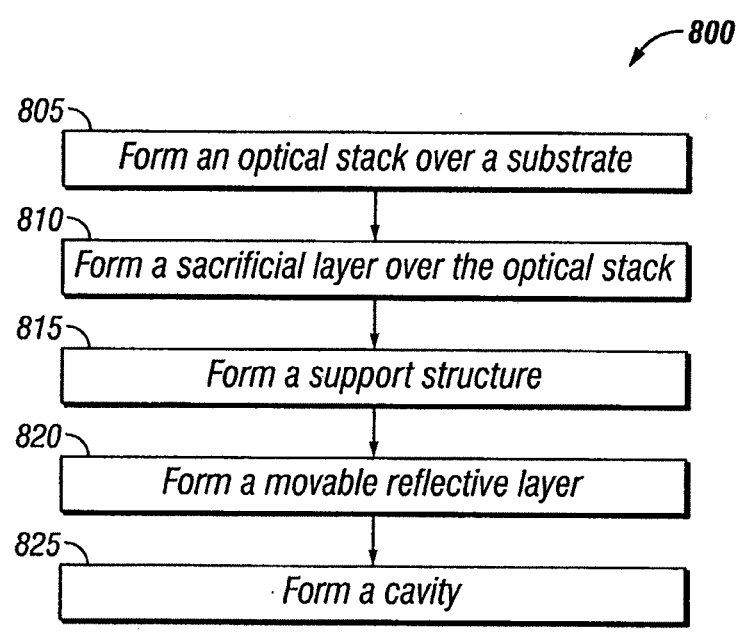
FIG. 8 is a flow diagram illustrating certain steps in an embodiment of a method of making an interferometric modulator.

FIG. 8 is a flow diagram illustrating certain steps in an embodiment of a manufacturing process 800 for an interferometric modulator. Such steps may be present in a process for manufacturing, e.g., interferometric modulators of the general type illustrated in FIGS. 1 and 7, along with other steps not shown in FIG. 8. With reference to FIGS. 1, 7 and 8, the process 800 begins at step 805 with the formation of the optical stack 16 over the substrate 20. The substrate 20 may be a transparent substrate such as glass or plastic and may have been subjected to prior preparation step(s), e.g., cleaning, to facilitate efficient formation of the optical stack 16. As discussed above, the optical stack 16 is electrically conductive, partially transparent and partially reflective, and may be fabricated, for example, by depositing one or more of the layers onto the transparent substrate 20. In some embodiments, the layers are patterned into parallel strips, and may form row electrodes in a display device. In some embodiments, the optical stack 16 includes an insulating or dielectric layer that is deposited over one or more metal layers (e.g., reflective and/or conductive layers).

The process 800 illustrated in FIG. 8 continues at step 810 with the formation of a sacrificial layer over the optical stack 16. The sacrificial layer is later removed (e.g., at step 825) to form the cavity 19 as discussed below and thus the sacrificial layer is not shown in the resulting interferometric modulator 12 illustrated in FIGS. 1 and 7. The formation of the sacrificial layer over the optical stack 16 may include deposition of a $XeF_2$-etchable material such as molybdenum or amorphous silicon, in a thickness selected to provide, after subsequent removal, a cavity 19 having the desired size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating.

The process 800 illustrated in FIG. 8 continues at step 815 with the formation of a support structure e.g., a post 18 as illustrated in FIGS. 1 and 7 or a rivet as discussed below. The formation of the post 18 may include the steps of patterning the sacrificial layer to form a support structure aperture, then depositing a material (e.g., a polymer or silicon dioxide) into the aperture to form the post 18, using a deposition method such as PECVD, thermal CVD, or spin-coating. In some embodiments, the support structure aperture formed in the sacrificial layer extends through both the sacrificial layer and the optical stack 16 to the underlying substrate 20, so that the lower end of the post 18 contacts the substrate 20 as illustrated in FIG. 7A. In other embodiments, the aperture formed in the sacrificial layer extends through the sacrificial layer, but not through the optical stack 16. For example, FIG. 7C illustrates the lower end of the support post plugs 42 in contact with the optical stack 16. More detailed discussions of other embodiments providing for formation of posts and rivets are presented below.

The process 800 illustrated in FIG. 8 continues at step 820 with the formation of a movable reflective layer such as the movable reflective layer 14 illustrated in FIGS. 1 and 7. The movable reflective layer 14 may be formed by employing one or more deposition steps, e.g., reflective layer (e.g., aluminum, aluminum alloy) deposition, along with one or more patterning, masking, and/or etching steps. As discussed above, the movable reflective layer 14 is typically electrically conductive, and may be referred to herein as an electrically conductive layer. Since the sacrificial layer is still present in the partially fabricated interferometric modulator formed at step 820 of the process 800, the movable reflective layer 14 is typically not movable at this stage. A partially fabricated interferometric modulator that contains a sacrificial layer may be referred to herein as an "unreleased" interferometric modulator.

The process 800 illustrated in FIG. 8 continues at step 825 with the formation of a cavity, e.g., a cavity 19 as illustrated in FIGS. 1 and 7. The cavity 19 may be formed by exposing the sacrificial material (deposited at step 810) to an etchant. For example, an etchable sacrificial material such as molybdenum or amorphous silicon may be removed by dry chemical etching, e.g., by exposing the sacrificial layer to a gaseous or vaporous etchant, such as vapors derived from solid xenon difluoride ($XeF_2$) for a period of time that is effective to remove the desired amount of material, typically selectively relative to the structures surrounding the cavity 19. Other etching methods, e.g. wet etching and/or plasma etching, may also be used. Since the sacrificial layer is removed during step 825 of the process 800, the movable reflective layer 14 is typically movable after this stage. After removal of the sacrificial material, the resulting fully or partially fabricated interferometric modulator may be referred to herein as a "released" interferometric modulator.

Figure 9A:
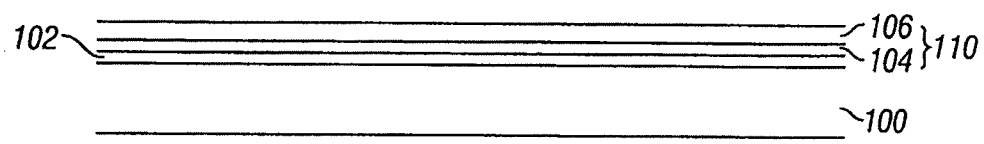
FIGS. 9A-9G are schematic cross sections illustrating certain steps in a process for fabricating an interferometric modulator having post support structures.

In one embodiment, support structures may take the form of post structures (e.g., posts 18 shown in FIGS. 1 and 7) underlying the movable layer. An exemplary process for fabricating an interferometric modulator comprising support posts is discussed with respect to FIGS. 9A-9G. In various embodiments, fabricating an interferometric modulator comprises forming an optical stack on a substrate, which may be a light-transmissive substrate, and in further embodiments is a transparent substrate. The optical stack may comprise a conductive layer, which forms an electrode layer on or adjacent the substrate; a partially reflective layer, which reflects some incident light while permitting some light to reach the other components of the interferometric modulator element; and a dielectric layer, which insulates the underlying electrode layer from the other components of the interferometric modulator. In FIG. 9A, it can be seen that a transparent substrate 100 is provided, and that a conductive layer 102 and a partially reflective layer 104 are deposited over the substrate 100. A dielectric layer 106 is then deposited over the partially reflective layer 104. In some embodiments, the conductive layer 102 is transparent and comprises ITO, the partially reflective layer 104 comprises a semireflective thickness of metal, such as chromium (Cr), and the dielectric layer 106 comprises silicon oxide ($SiO_2$). The dielectric layer may also be a stack comprising $SiO_2$ and $Al_2O_3$. At some point during this process, at least the conductive layer 102 is patterned (not shown) to form row electrodes which will be used to address a row of interferometric modulators. In one embodiment, this patterning takes place after the deposition of the conductive and partially reflective layers 102 and 104, but prior to the deposition of the dielectric layer 106. The combination of the layers 102, 104, and 106 is referred to as the optical stack 110, and may be indicated by a single layer in later figures, for convenience. It will be understood that the composition of the optical stack 110 may vary both in the number of layers and the components of those layers, and that the layers discussed above are merely exemplary.

A variety of methods can be used to perform the patterning and etching processes discussed with respect to the various embodiments disclosed herein. The etches used may be either a dry etch or a wet etch, and may be isotropic or anisotropic. Suitable dry etches include, but are not limited to: $SF_6/O_2$, $CHF_3/O_2$, $SF_2/O_2$, $CF_4/O_2$, and $NF_3/O_2$. Generally, these etches are suitable for etching one or more of $SiO_x$, $SiN_x$, $SiO_xN_y$, spin-on glass, Nissan Hard coat, and $TaO_x$, but other materials may also be etched by this process. Materials which are resistant to one or more of these etches, and may thus be used as etch barrier layers, include but are not limited to Al, Cr, Ni, and $Al_2O_3$. In addition, wet etches including but not limited to PAD etches, BHF, KOH, and phosphoric acid may be utilized in the processes described herein. Generally, these etches may be isotropic, but can be made anisotropic through the use of a reactive ion etch (RIE), by ionizing the etch chemicals and shooting the ions at the substrate. The patterning may comprise the deposition of a photoresist (PR) layer (either positive or negative photoresist), which is then used to form a mask. Alternately, a hard mask can be utilized. In some embodiments, the hard mask may comprise metal or $SiN_x$, but it will be understood that the composition of the hard mask may depend on the underlying materials to be etched and the selectivity of the etch to be used. In The hard mask is typically patterned using a PR layer, which is then removed, and the hard mask is used as a mask to etch an underlying layer. The use of a hard mask may be particularly advantageous when a wet etch is being used, or whenever processing through a mask under conditions that a PR mask cannot handle (such as at high temperatures, or when using an oxygen-based etch). Alternate methods of removing layers may also be utilized, such as an ashing etch or lift-off processes.

Figure 9B:
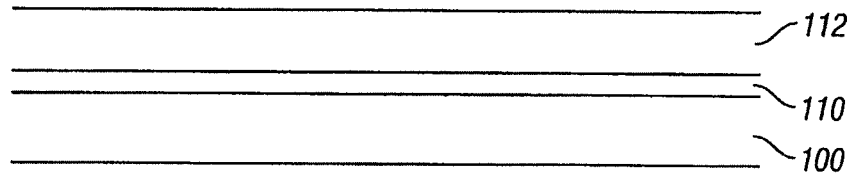
Figure 9C:
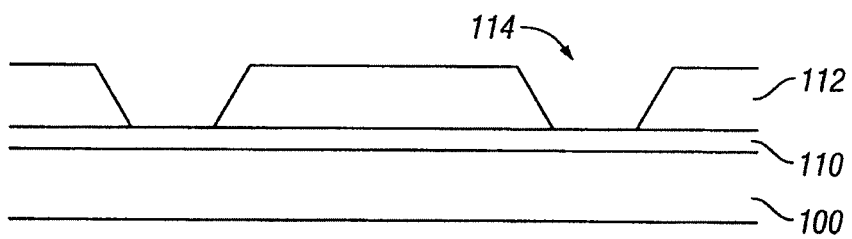

In FIG. 9B, it can be seen that a layer 112 of sacrificial material is deposited over the optical stack 110. In one embodiment, this sacrificial layer 112 comprises molybdenum (Mo), but in other embodiments, the sacrificial layer 112 may comprise other materials, such as, for example, amorphous silicon (a-Si). In FIG. 9C, the sacrificial layer 112 has been patterned and etched to form tapered apertures 114, which correspond to the locations of post or support regions. These apertures 114 are advantageously tapered in order to facilitate continuous and conformal deposition of overlying layers.

Figure 9D:
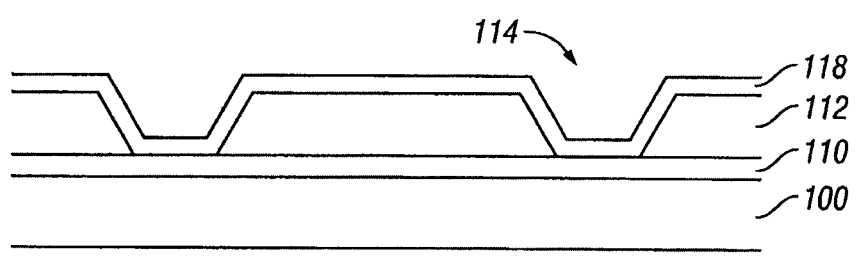
Figure 9E:
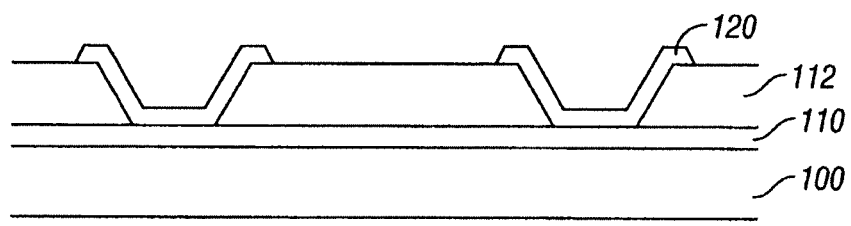

In FIG. 9D, a layer 118 of post material is deposited over the patterned sacrificial layer 114, such that the post layer 118 also coats the side walls and the base of the tapered apertures 114. In certain embodiments, the post layer 118 may comprise silicon nitride ($SiN_x$) or $SiO_2$, although a wide variety of other materials may be used. In FIG. 9E, the post layer 118 is patterned and etched to form posts 120. It can be seen in FIG. 9E that the edges of the posts 120 preferably taper which, like the tapered or sloped sidewalls of the apertures 114, facilitate continuous and conformal deposition of overlying layers.

Figure 9F:
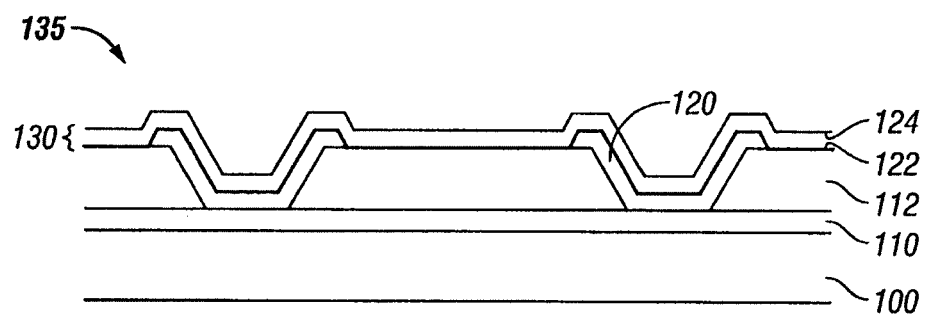

In FIG. 9F, a highly reflective layer 122 is deposited over the posts 120 and the exposed portions of the sacrificial layer 112. A mechanical layer 124 is then deposited over the highly reflective layer 122. For convenience, the highly reflective layer 122 and the mechanical layer 124 may be referred to and depicted in subsequent figures as a deformable reflective layer 130 (see FIG. 9G), whenever the mechanical layer 124 is deposited directly over the highly reflective layer 122. In alternate embodiments, the deformable reflective layer 130 may comprise a single layer which has the desired optical and mechanical properties. For example, mechanical or moving layers for mechanical switches need not include reflective layers. Since the sacrificial layer 112 is still present at this stage of the process 200, the mechanical layer or deformable reflective layer 130 is typically not yet movable. A partially fabricated MEMS device 135, e.g. a partially fabricated interferometric modulator, that contains a sacrificial layer (the layer 112 in this embodiment) may be referred to herein as an "unreleased" MEMS device.

Figure 9G:
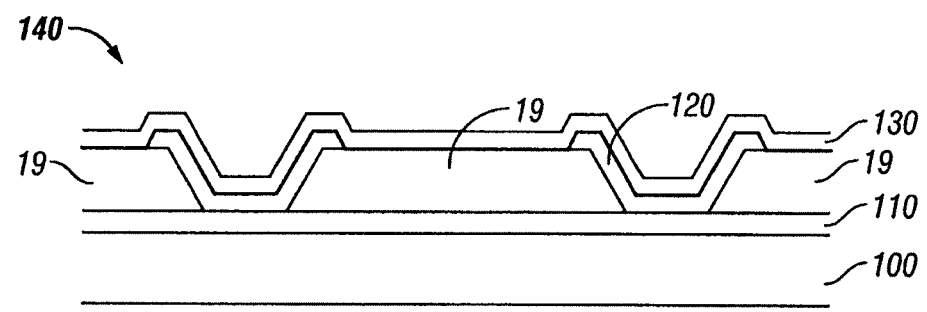

In FIG. 9G, a release etch is performed to remove the sacrificial layer 112, forming an interferometric modulator element 140 having an interferometric cavity 19 through which the deformable reflective layer 130 can be moved in order to change the color reflected by the released interferometric modulator element 140. Prior to the release etch, the deformable reflective layer 130 is preferably patterned to form columns (not shown), and may advantageously be further patterned to form etch holes (not shown) which facilitate access to the sacrificial layer by the release etch.

Figure 10A:
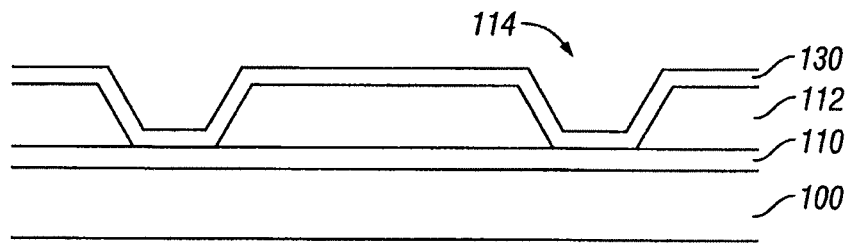
FIGS. 10A-10D are schematic cross sections illustrating certain steps in a process for fabricating an interferometric modulator having rivet support structures.

In another embodiment support structures may take the form of rivet structures overlying the mechanical or deformable reflective layer 130. A process for forming overlying rivet structures is discussed and depicted with respect to FIGS. 10A-10D. In one embodiment, this process includes the steps of FIGS. 9A-9C. In FIG. 10A, it can be seen that a mechanical layer or deformable reflective layer 130 is deposited over the patterned sacrificial layer 112, such that the deformable reflective layer 130 coats the side walls and base of the tapered apertures 114.

Figure 10B:
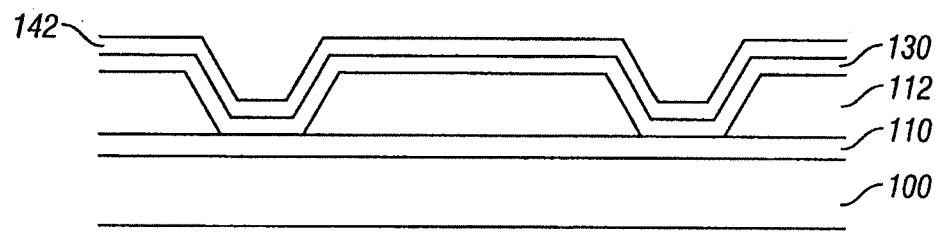
Figure 10C:
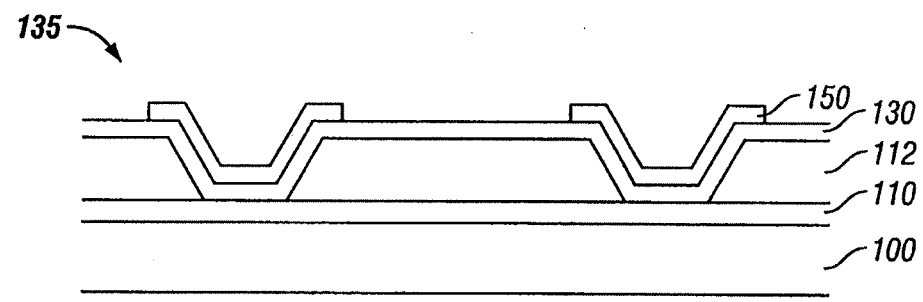
Figure 10D:
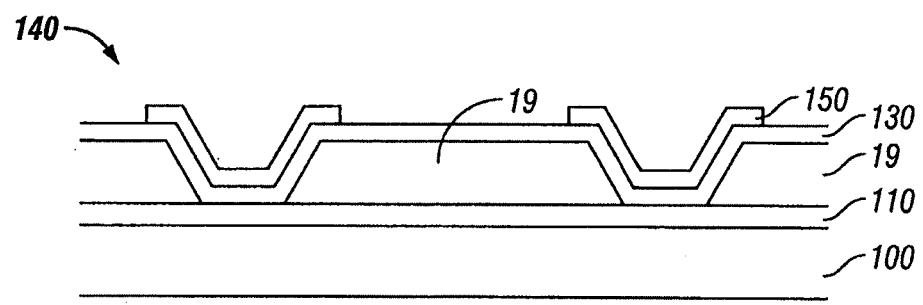

In FIG. 10B, a rivet layer 142 is deposited over the deformable reflective layer 130. The rivet layer 142 may comprise, for example, $SiO_2$, $SiN_x$, or Ni, but a wide variety of alternate materials may be utilized for the rivet layer 142. Next, in FIG. 10C, the rivet layer is patterned and etched to form rivet structures 150. Since the sacrificial layer 112 is still present at this stage of the process 200, the mechanical layer or deformable reflective layer 130 is typically not yet movable. A partially fabricated MEMS device 135, e.g. a partially fabricated interferometric modulator, that contains a sacrificial layer (the layer 112 in this embodiment) may be referred to herein as an "unreleased" MEMS device. In FIG. 10D, it can be seen that the sacrificial layer 112 has been removed via a release etch, permitting the deformable reflective layer 130 to be able to move through the interferometric cavity 19 of the released interferometric modulator 140.

It will be understood that additional support may be provided through a combination of posts 120 (FIG. 9G) and rivets 150 (FIG. 10D). For instance, rivets 150 may be formed in some locations within an interferometric modulator, and posts 120 may be formed at others, or rivets 150 may be formed overlying the posts 120.

In the process described with respect to FIGS. 9A-9G, it can be seen that the sacrificial layer 112 is exposed to the etching process which patterns the inorganic post 120 (see FIG. 9E) and the support post 120 is similarly exposed to the release etch which removes the sacrificial layer 112 (see FIG. 9G). Unless modifications are made to the process flow, the support post material 118 should be selectively etchable relative to the sacrificial material, and vice versa. In addition even if an etch exists which will selectively etch one relative to another, alternate etches which are not selective may be preferable for other reasons.

Flexure of the support structures and the mechanical layer may occur as a result of unbalanced stresses within the support structures and the mechanical layer. In some situations, these unbalanced stresses are the result of inherent stresses within the materials forming the support structures and the mechanical layer, which are a function of the materials comprising those layers. An additional source of unbalanced stresses is the thermal expansion of the layers, which is a function of the mismatch between the coefficients of thermal expansion of two different materials, the operating temperature of the MEMS device, the moduli of elasticity of the materials, and the material deposition conditions. When adjoining layers have different coefficients of thermal expansion, deflection may not only be caused by the relative change in size of adjoining layers, but the total deflection may vary as the result of the operating temperature. Because such deflection will alter the height of the interferometric cavity, and therefore affect the color reflected by the interferometric modulator element, it is desirable to take this flexure into account in manufacturing interferometric modulator elements with different cavity heights. In one embodiment, a single thickness sacrificial layer is applied, rather than multiple depositions of sacrificial material corresponding to the multiple cavity heights, and posts and/or rivets exhibiting differing flexures will produce multiple cavity heights upon release of the interferometric modulators.

Figure 11:
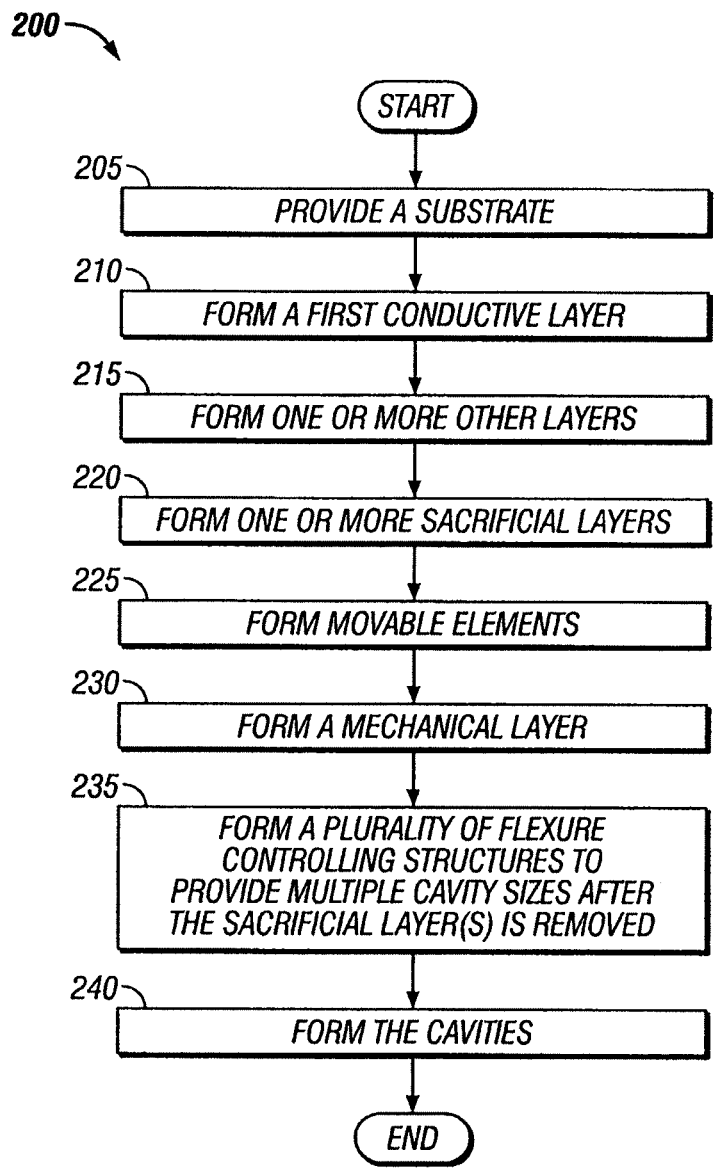
FIG. 11 is a flow diagram illustrating certain steps in an embodiment for fabricating an interferometric modulator having flexure controllers.

FIG. 11 is a flow diagram illustrating certain steps in an embodiment of a method of making a device such as a MEMS device having a cavity. Such steps may be present in a process for manufacturing, e.g., interferometric modulators of the general type illustrated in FIGS. 1 and 7, along with other steps not shown in FIG. 11. Many of the steps of the process in FIG. 11 are similar to steps depicted schematically in FIGS. 9 and 10. The process of FIG. 11 may be used to manufacture MEMS devices such as the various unreleased and released interferometric modulators depicted in FIGS. 12A through 12K. The devices shown in FIG. 12 include flexure controllers that will produce multiple interferometric cavity heights while requiring fewer deposition, masking and etching steps. With reference to FIGS. 9, 10, 11 and 12, the process 200 begins at step 205 where a substrate 100 is provided. In one embodiment, the substrate 100 may comprise any transparent material such as glass or plastic.

The process 200 continues at step 210 with the formation of a first electrically conductive layer 102 on the substrate 100 as shown in FIG. 9A. The first electrically conductive layer 102 can be a single layer structure or multiple sub-layer structure as described above.

The process 200 continues at step 215 with the formation of one or more other layers, e.g., a partially reflective layer 104, and a dielectric layer 106 over at least a portion of the electrically conductive layer 105 as shown in FIG. 9A. The combination of the layers 102, 104, and 106 is referred to as the optical stack 110 as shown in FIG. 9B and FIG. 12.

Figure 12A:
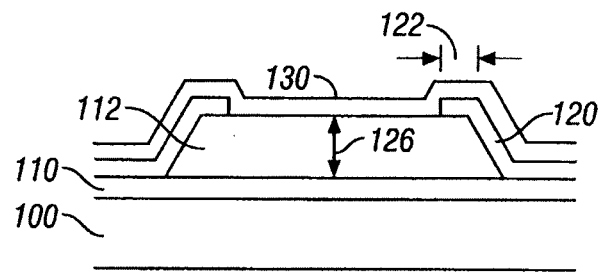
FIGS. 12A-12K show cross sections of alternative embodiments of interferometric modulators having different flexure controllers that can be fabricated using the method of FIG. 11.
Figure 12B:
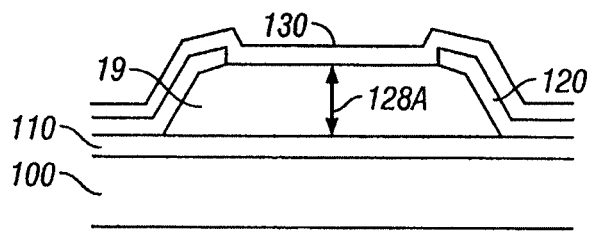

The process 200 continues at step 220 with the formation of a sacrificial layer 112 as shown in FIG. 9B. In FIGS. 9, 10 and 12A through 12H, a single sacrificial layer is formed between the deformable reflective layer 130 (e.g., including both the highly reflective layer 122 and the mechanical layer 124) and the optical stack 110. In the interferometric modulators shown in FIGS. 12I, 12J and 12K, a first sacrificial layer 112A is formed over the optical stack 110 prior to the formation of a movable reflective layer 14 (including the highly reflective layer 122) at step 225. In the embodiments shown in FIGS. 12I, 12J and 12K, the movable reflective layer 14 may be considered as a movable element that is suspended over the substrate by a mechanical layer 34. Without loss of generality, the term movable element will herein be used to describe any movable element in a MEMS device, e.g., a movable or deformable reflective layer 130 as shown in FIGS. 9 and 10, any of the movable reflective layers 14, 14a or 14b as shown in FIGS. 1 and 7, or the movable elements 14 as shown in FIGS. 12I, 12J and 12K. The movable element 14 may be formed by a deposition followed by patterning and etching. After forming the movable element 14, a second sacrificial layer 112B is deposited over the movable element 14. Subsequent patterning and etching of the second sacrificial layer 112B (or the single sacrificial layer 112) may performed to form support structure apertures 114 as shown in FIGS. 9C and 10A as well as apertures for attaching the mechanical layer 34 to the movable element 14 as shown in FIG. 12. In a preferred embodiment only one deposition is performed in forming the sacrificial layer 112 (or 112A) between the movable reflective element 14 (as shown in FIG. 12) or the deformable reflective layer 130 (as shown in FIGS. 9 and 10) and the substrate.

In an embodiment of an interferometric modulator, the sacrificial layer is deposited so as to form, upon subsequent removal, an interferometric cavity with a thickness in the range of about 1000 angstroms to about 5000 angstroms between the movable layer 14 or the deformable reflective layer 130 and the optical stack 16 of FIGS. 1, 7 and 12.

In the dual sacrificial layer embodiments shown in FIGS. 12I, 12J and 12K, the process 200 continues at step 230 with the formation of a mechanical layer 34 over at least a portion of the sacrificial layer 112B and at least a portion of the movable element 14. In the single sacrificial layer embodiment of FIGS. 9 and 10, the mechanical layer 34 is replaced by the mechanical layer 124 that is formed over the highly reflective layer 122. The mechanical layers 34 and 124 may be comprised of the same or different materials.

The process continues at step 235 where flexure controllers are formed. In the exemplary process 200 shown in FIG. 11, a plurality of flexure controllers having different dimensions are formed in order to provide multiple cavity sizes after removal of the sacrificial layer. In another embodiment, a flexure controller is formed to provide a desired cavity size that is either smaller or larger than the cavity prior to removal of the sacrificial layer. The flexure controllers, e.g., post structures and/or rivet structures, induce displacement of a membrane to which the flexure controllers are attached (e.g., the deformable reflective layer 130), subsequent to removal of the sacrificial layer(s) 112. Details of some exemplary flexure controllers will be discussed below.

The process 200 continues at step 240 where the sacrificial layer 112 is removed (e.g., by etching) to form a cavity 19 as shown in FIG. 10G. The removal of the sacrificial layers can be accomplished, for example, by exposure to an etchant such as $XeF_2$, $F_2$ or HF alone or in combination. In a preferred embodiment, substantially all of the sacrificial layer 112 is removed in the etching process. In one embodiment, the cavity 19 is an interferometric cavity between an optical stack 110 and the deformable reflective layer 130. After formation of the cavity 19, the resulting MEMS device, e.g., the interferometric modulator, is in a "released" state.

Some examples of flexure controllers that may be formed at step 235 of the process 200 will now be discussed. For example, FIG. 12A shows an unreleased device, e.g., an interferometric modulator, which includes posts 120 having a wing portion of dimension 122 substantially parallel to the substrate 100 and the deformable reflective layer 130. The sacrificial layer 112 has a thickness 126 as measured perpendicular to the substrate 100 and optical stack 110. FIG. 12B shows the device after removal of the sacrificial layer 112 forming the cavity 19. The released device of FIG. 12B has a cavity depth of 128A as measured perpendicular to the substrate 100 and optical stack 110. The depth of the cavity between the released deformable layer 130 and the optical stack 110 (shown as Ref. No. 128A) is measurably larger in this example than the unreleased cavity depth of 126 shown in FIG. 12A. The difference in cavity depth is due to the flexure controlled by the combined stresses of the posts 120 and the deformable reflective layer 130.

Figure 12C:
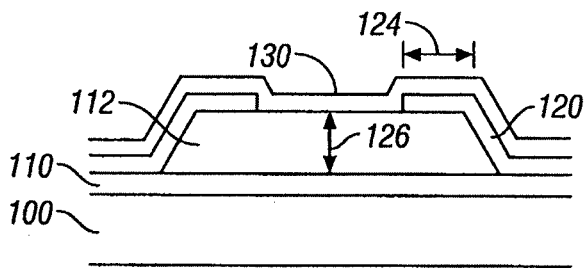
Figure 12D:
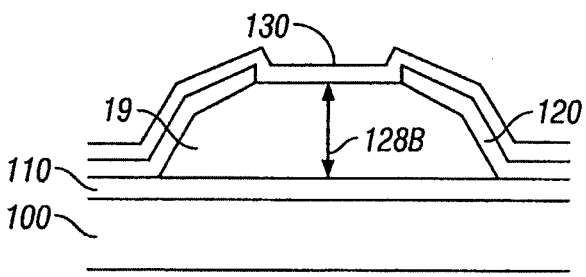

FIG. 12C shows a second example of an unreleased device, e.g., an interferometric modulator, which includes posts 120 having a wing portion of dimension 124 substantially parallel to the substrate 100 and the deformable reflective layer 130. In this example, the sacrificial layer 112 has approximately the same thickness 126 as measured perpendicular to the substrate 100 and optical stack 110 as the device shown in FIG. 12A. However, the overlap 124 of FIG. 12C is larger than the overlap 122 of FIG. 12A. The overlaps 122 and 124 of the posts 120 are the result of patterning and etching steps as discussed above and shown in FIG. 9E. FIG. 12D shows the device of FIG. 12C after removal of the sacrificial layer 112 forming the cavity 19. The released device of FIG. 12D has a cavity depth of 128B as measured perpendicular to the substrate 100 and optical stack 110. The depth of the cavity between the released deformable layer 130 and the optical stack 110 (shown as Ref. No. 128B) is measurably larger in this example than the unreleased cavity depth of 126 shown in FIGS. 12A and 12C and larger than the released cavity depth 128A shown in FIG. 12B. The difference in cavity depth is due to the flexure controlled by the combined stresses of the posts 120 (having the overlap 124 compared to the overlap 122 of FIG. 12A) and the deformable reflective layer 130.

Figure 12E:
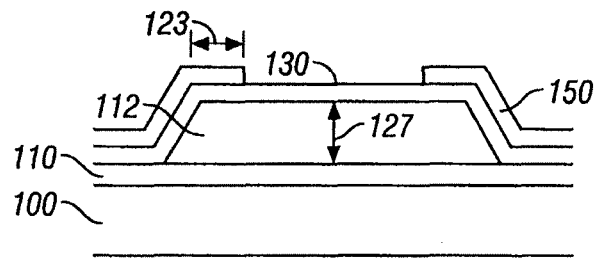
Figure 12F:
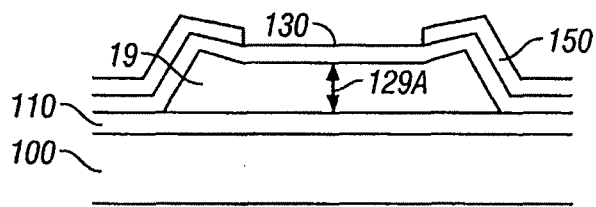
Figure 12G:
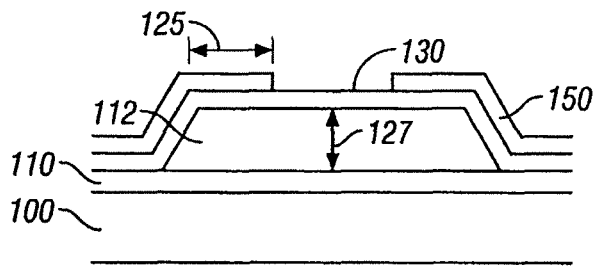

FIGS. 12E and 12G show examples of a devices wherein the flexure controllers comprise rivets 150 (as discussed above and shown in FIG. 10) overlying the deformable reflective layer 130. The rivets 150 of FIG. 12E have a smaller overlapping portion (or wing) than the rivets 150 of FIG. 12G (see dimensions 123 and 125). In this example, the depth 127 of the sacrificial layer 112 is approximately the same for both devices. However, after release of the devices, the corresponding cavity depths may vary significantly as depicted by the depth 129A of FIG. 12F and the depth 129B of FIG. 12H.

FIGS. 12I, 12J and 12K depict examples of unreleased interferometric modulators with various flexure controlling post structures 120 and rivet structures 150. FIG. 12I has rivet structures 150 overlying the mechanical layer 34 and post structures underlying the mechanical layer 34 where the rivets 150 and posts 120 have similar overlap. The rivet structures 150 of FIG. 12J, exhibit much less overlap while the post structures 120 exhibit more overlap. FIG. 12K depicts a device where the rivet structures have significantly more overlap that the post structures 120.

During fabrication of interferometric modulators, upward flexures of movable reflective layers, upon releasing of the device (as depicted in FIGS. 12B and 12D), of about 500 angstroms or less have been observed. However, downward flexures of movable reflective layers, upon releasing of the device (as depicted in FIGS. 12F and 12I), typically never occur. By varying the size and/or material of which the flexure controllers, e.g., posts and/or rivets, are comprised, increased upward flexure and/or downward flexure of membranes may be achieved. For example, depositing thinner post and/or rivet layers may result in less upward flexure or increased downward flexure. Forming flexure controllers of more rigid materials may result in less flexure. Decreasing tensile stress in an overlying flexure controller, e.g., a rivet, may reduce upward flexure. Decreasing tensile stress in an underlying flexure controller, e.g., a post, may increase upward flexure. Tensile stresses tend to shrink the portion of the device in which they are contained. In contrast, compressive stresses tend to expand the portion of the device in which they are contained. One of skill in the art will recognize that by varying the relative sizes of posts 120 and/or rivets 150 as well as varying materials of which the posts 120 and/or rivets 150 are comprised, significantly different released cavity depths may be achieved. Ranges of flexure, upward or downward, including about 50 to 100, about 100 to 150, about 150 to 200, about 200 to 250, about 250 to 300, about 300 to 350, about 350 to 400, about 400 to 450, about 450 to 500, about 500 to 550, about 550 to 600, about 600 to 650, about 650 to 700, about 700 to 750, about 750 to 800, about 800 to 850, about 850 to 900, about 900 to 950, about 950 to 1000, about 1000 to 1050, about 1050 to 1100, about 1100 to 1150, about 1150 to 1200 angstroms or more may be achieved by varying sizes and/or material properties of flexure controllers as discussed above. In addition, increments or decrements to these ranges of about 5, 10, 15, 20, and 25 angstroms may be possible.

The methods described herein for controlling cavity depth of MEMS devices may have a positive effect on the manufacture of various devices including MEMS devices that comprise cavities, e.g., interferometric modulators. For example, Table 1 summarizes the results of a set of experiments in which various post structure overlaps were fabricated in interferometric modulators having similar unreleased sacrificial layer depths. Post structure overlaps, similar to the overlaps 122 and 124 depicted in FIGS. 12A and 12C respectively, were varied from 1 micron to 3 microns for interferometric modulator pixels measuring 222 microns by 222 microns. The thickness of the sacrificial layer in these experiments was about 1150 angstroms. After releasing the interferometric modulators, the undriven cavity depth (as measured perpendicular to the substrate) between the movable element and the optical stack varied significantly.

TABLE 1

| Post Overlap (μm) | Undriven Cavity Depth (Angstroms) |
|---|---|
| 1.0 | 1400 |
| 2.0 | 1775 |
| 2.5 | 2000 |
| 3.0 | 2200 |

Figure 12H:
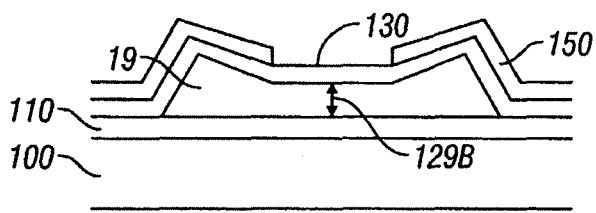
Figure 12I:
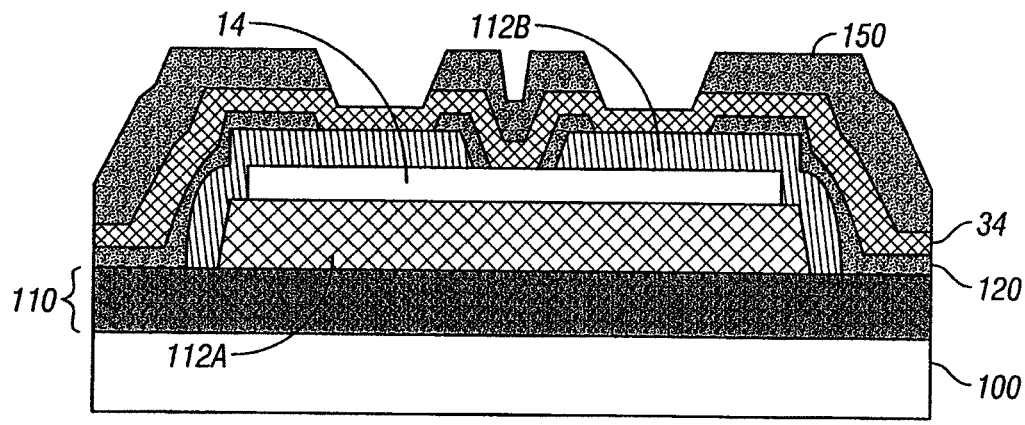
Figure 12J:
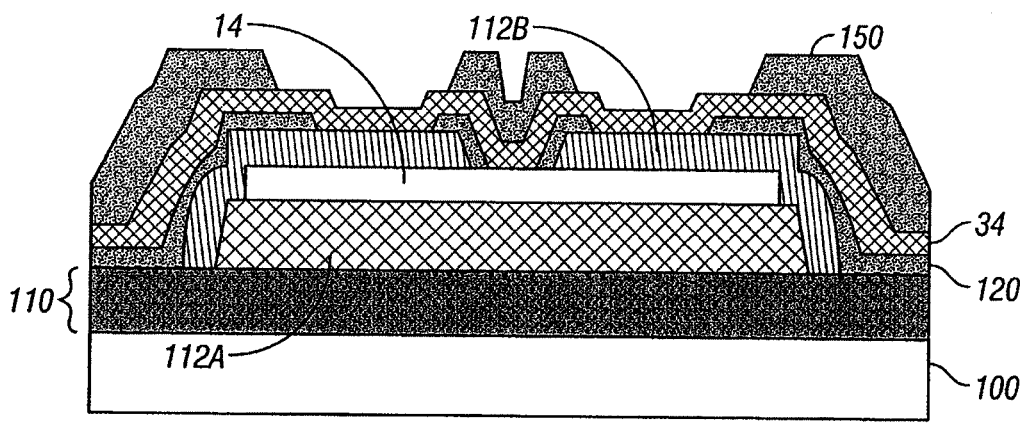
Figure 12K:
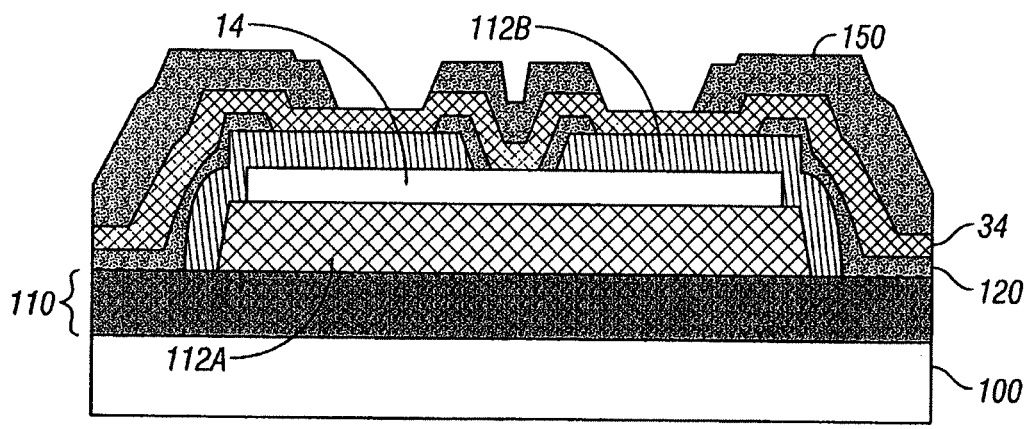

Relatively small changes in post overlap resulted in more than 50% variation in undriven cavity depth from the shallowest to the deepest cases shown in Table 1. By varying dimensions and/or materials of posts and/or rivets as discussed above, even larger variations may be demonstrated. The post structures used in the test resulted in increases in gap size due to the tensile stress in the post structures (See FIGS. 12B and 12D). However, by utilizing rivet structures and/or combinations of post and rivet structures, decreases or sagging of the deformable reflective layer (as depicted in FIGS. 12F and 12H) may also be realized. As discussed above, cavity depths of about 1000 angstroms to about 5000 angstroms are desirable for interferometric modulators. A range of cavity sizes from about 2000 angstroms to about 4000 angstroms is preferred for modulating visible light while smaller and/or larger cavity sizes may be used for modulating hyperspectral light, ultraviolet light and/or infrared light. Increases in cavity depth of about 30% to 40%, about 40% to 50%, about 50% to 60%, about 60% to 70%, about 70% to 80%, about 80% to 90%, about 90% to 100% or more may be achieved. In addition, increments or decrements to these ranges of about 1%, 2%, 3%, 4% and 5% may be obtained.

In addition to the experiments discussed above that have shown the effect that various structures of flexure controllers have on cavity depth, analytical studies have also been made that simulate the experiments and indicate that additional capability of controlling the cavity depth may also be afforded. FIGS. 13A-13F show results of analytical studies designed to show the effects that altering the characteristics of flexure controller structures can have on a deflection of a supported layer upon release of the device. The analytical equations used in the studies model the effects of stresses, both tensile and compressive, contained in the various rivets and/or post structures when combined with the stresses contained in a layer that they are supporting. The modeled stresses contained in the support structures and in the supported layer represent stresses that may result depending on the conditions under which the different layers are formed. Compressive stresses, designated by negative stress levels in the studies, tend to expand the portion of the device in which they are contained. Tensile stresses, designated by positive stress levels in the studies, tend to shrink the portion of the device in which they are contained. The studies looked at various combinations of posts and/or rivet structures. The studies also modeled the effect that ranges of certain dimensions and/or characteristics of different portions of the flexure controller structures have on the resulting deflection. The dimensions and characteristics of the flexure controller structures that were analyzed include layer thickness, overlap length, and stress level of the various portions of the device. The analysis modeled the flexure controller posts and/or rivets and the supported layer as cantilevered beams. The structures used in the analysis are representative of any of several types of devices including, but not limited to, MEMS devices, light modulating devices, and any device comprising one or more thin film layers having a cavity between one of the thin film layers and the substrate and/or between two of the thin film layers.

The results shown in FIGS. 13A-13F will be discussed in relation to the interferometric modulator embodiments shown in FIG. 12. It should be noted that the interferometric modulator is an example of a device that may be modeled using the analytical methods presented here, and other devices may also be analyzed and manufactured using the various methods described above.

Figure 13A:
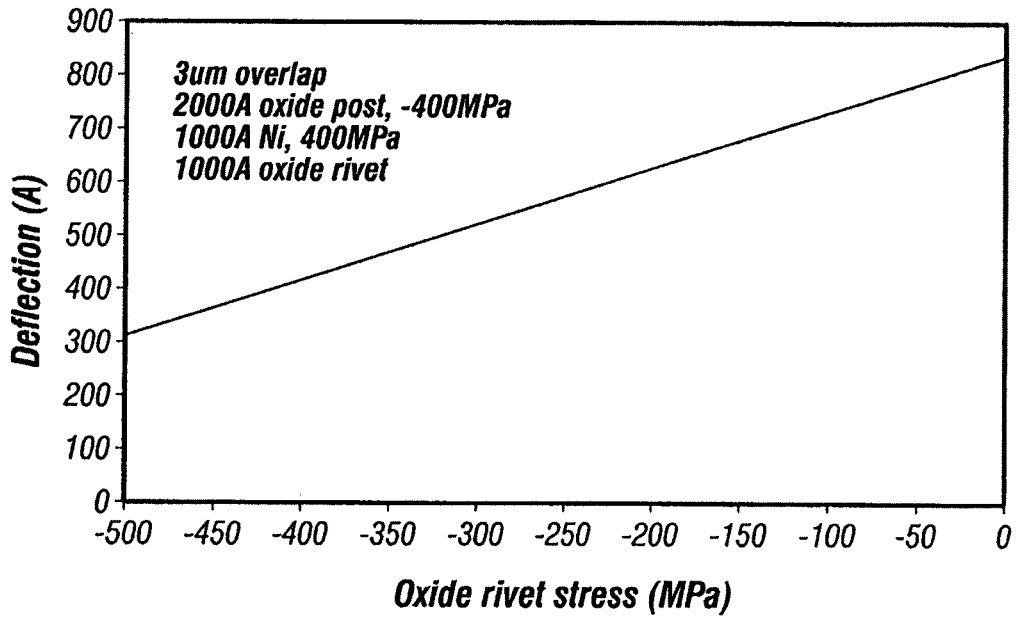
FIGS. 13A-13F show results of analytical studies designed to show the effects that altering the characteristics of flexure controller structures can have on a deflection of a supported layer upon release of the device.
Figure 13B:
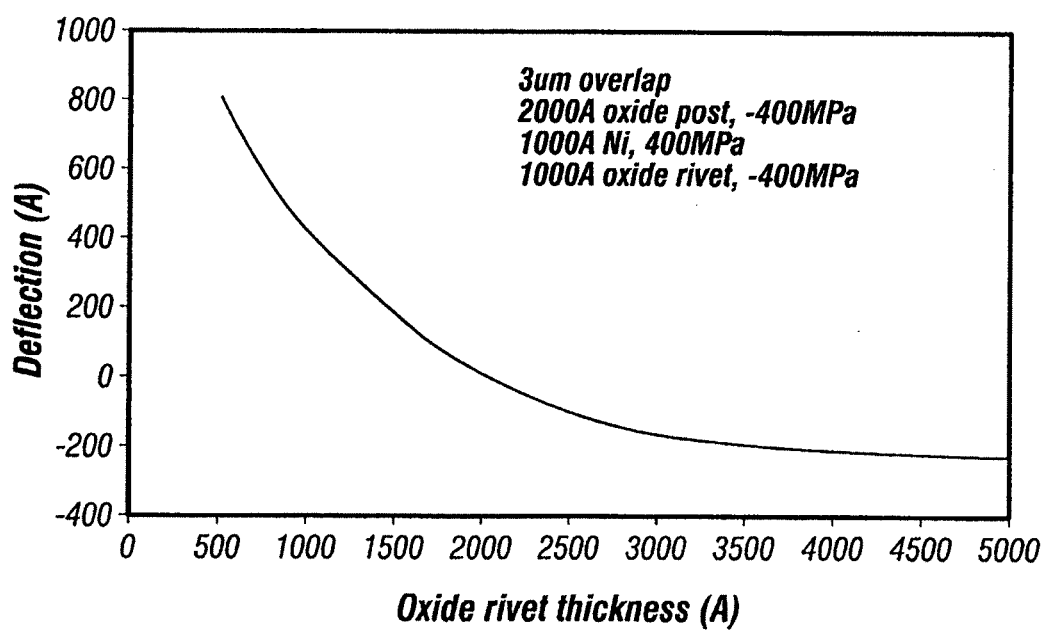

The configuration of the device analyzed in the first example includes a 1000 angstrom thick (as measured perpendicular to the substrate 100) deformable reflective layer 130 comprised of Ni. The Ni layer is modeled with a 400 MPa tensile stress that is representative of the type of stress levels seen under typical deposition conditions. The device also includes a 2000 angstrom thick (as measured perpendicular to the substrate) oxide post structure 120. The oxide post structures modeled in the analysis comprised $SiO_2$. The post structure overlaps the deformable reflective layer 130 by 3 µm, where the overlap is measured as depicted by the dimensions 122 and 124 shown in FIGS. 12A and 12C. The post structure is modeled with a −400 MPa compressive stress. The device also includes an oxide rivet structure 150, where the thickness of the rivet structure (as measured perpendicular to the substrate) is 1000 angstroms for FIG. 13A and is variable on the horizontal axis for FIG. 13B. The rivet structure overlaps the deformable reflective layer 130 by 3 µm, where the overlap is measured as depicted by the dimensions 123 and 125 shown in FIGS. 12E and 12G. The stress of the rivet structure is variable on the horizontal axis for the analysis results shown in FIG. 13B and is −400 MPa for the analysis results shown in FIG. 13B. FIGS. 13A and 13B show the resulting deflections, upon release of the sacrificial layer 112 resulting in the cavity 19, of the deformable reflective layer 130. Positive deflection values represent deflections away from the substrate 100 as depicted in FIGS. 12B and 12D. Negative deflection values represent deflection towards the substrate 100 as depicted in FIGS. 12F and 12H.

The results of FIG. 13A show that for increased compressive stress (more negative values), the deflection is lower, showing an estimated deflection of just over 300 angstroms for a −500 MPa oxide rivet stress. As the compressive stress is reduced to zero, the deflections become larger, showing an estimated deflection greater than 800 angstroms for a zero MPa stress level. Deflections of even greater values can be obtained by forming rivet structures with tensile stress levels (positive stress). The reason that all the deflections are positive (away from the substrate) in the example of FIG. 13A is that the combined oxide post stress of −400 MPa and the deformable reflective layer stress of 400 MPa both contribute to a positive deflection that the oxide rivet stress levels analyzed do not overcome. Smaller values of deflection, including negative deflection values, could be obtained by several methods, including applying more negative compressive rivet stress levels, reducing the thickness of the compressed oxide post, reducing the compressive stress of the oxide post, reducing the thickness of the compressed oxide post, increasing the thickness of the compressed oxide rivet, reducing the overlap length of the compressed oxide post, increasing the overlap length of the compressed rivet and other methods known to those of skill in the art. These methods all serve to reduce the energy levels of portions of the device contributing to upward deflections (e.g., the compressed post 120 and the stretched deformable reflective layer 130) and/or increase the energy levels of portions of the device contributing to downward deflections (e.g., the compressed rivet 150).

The results of FIG. 13B show that as the thickness of the compressed oxide rivet 150 is increased (increasing the energy contributing to a downward deflection), the deflection, upon release of the sacrificial layer 112, is reduce, even becoming a negative value for rivet thicknesses greater than about 2000 angstroms.

Figure 13C:
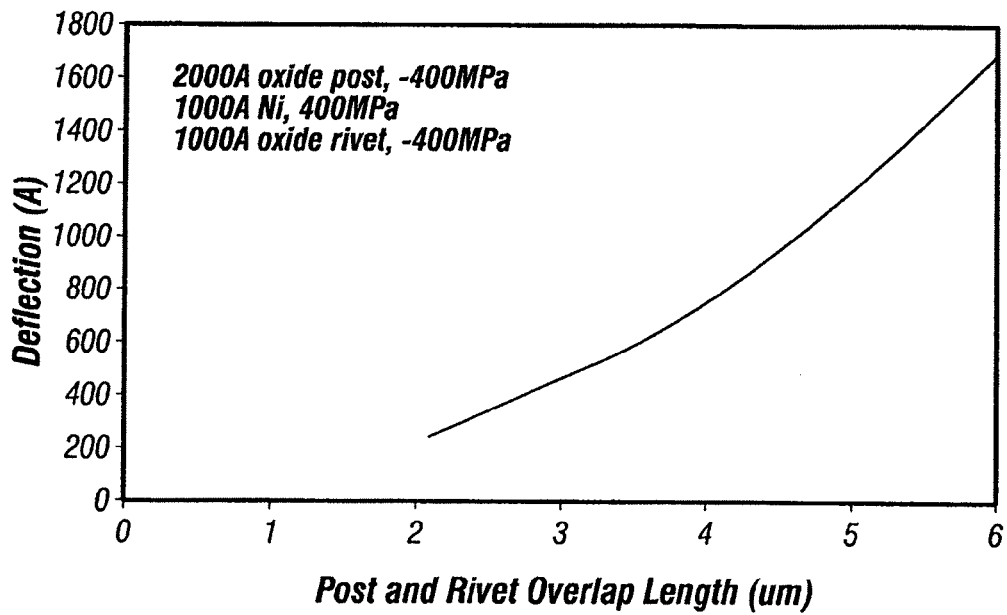

The next example includes a 2000 angstrom thick oxide post 120 with a compressive stress of −400 MPa, a 1000 angstrom thick oxide rivet 150 with a compressive stress of −400 MPa, and a 1000 angstrom thick deformable reflective Ni layer 130 with a tensile stress of 400 MPa. The overlap lengths of the post 120 (see the dimensions 122 and 124 in FIGS. 12A and 12C) and the rivet 150 (see the dimensions 123 and 125 in FIGS. 12E and 12G) are equal and are varied from about 2 µm to about 6 µm. FIG. 13C shows the estimated deflections of the deformable reflective layer 130 upon release of the sacrificial layer 112. Increasing the overlap lengths of both the post 120 and the rivet 150 increases deflections away from the substrate 100. As in the cases above, the compressed post 120 and the stretched deformable reflective layer 130 both contribute to the upward deflections and the compressed rivet 150 contributes to a downward deflection. In this case, the combined energies of the layer 130 and the post 120 outweigh the energy of the rivet 150 and the deflections are all positive. By varying the overlap lengths of the oxide post 120 and the oxide rivet 150 from about 2 µm to about 6 µm, the deflection of the layer 130 can be varied from about 200 angstroms to about 1700 angstroms.

Figure 13D:
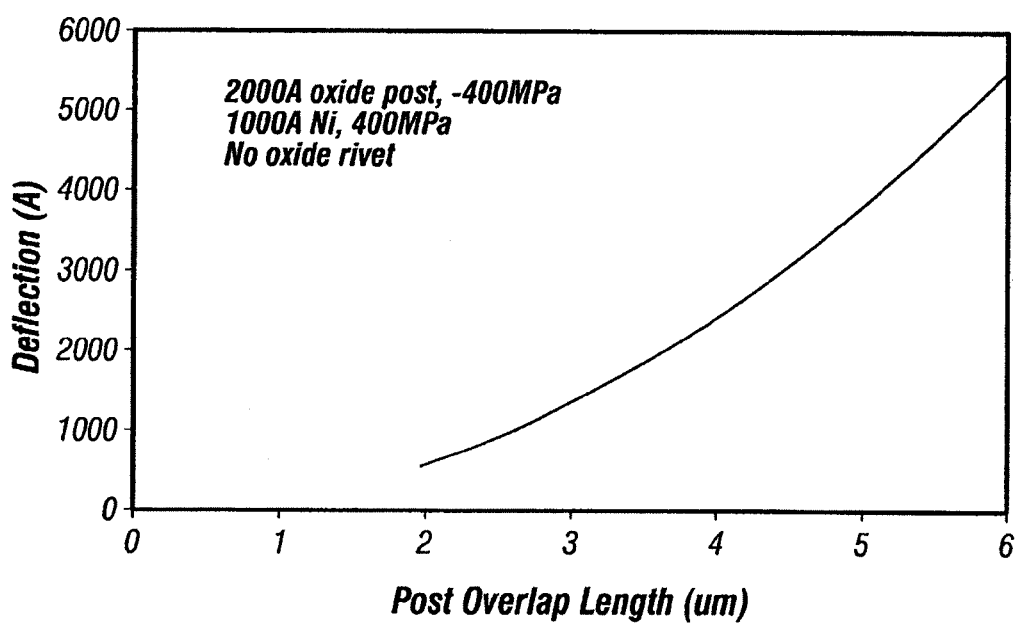

FIG. 13D shows deflections of the deformable reflective layer 130, upon release of the sacrificial layer 112, for a case similar to that of FIG. 13C except that there is no oxide rivet. In this example, the positive deflections of the deformable reflective layer 130 are even greater than without the rivet because the compressed rivet is not working against the upward deflections caused by the post 120 and the deformable reflective layer 130. By varying the overlap length of the oxide post 120 from about 2 µm to about 6 µm, the deflection of the layer 130 can be varied from about 500 angstroms to about 5500 angstroms.

Figure 13E:
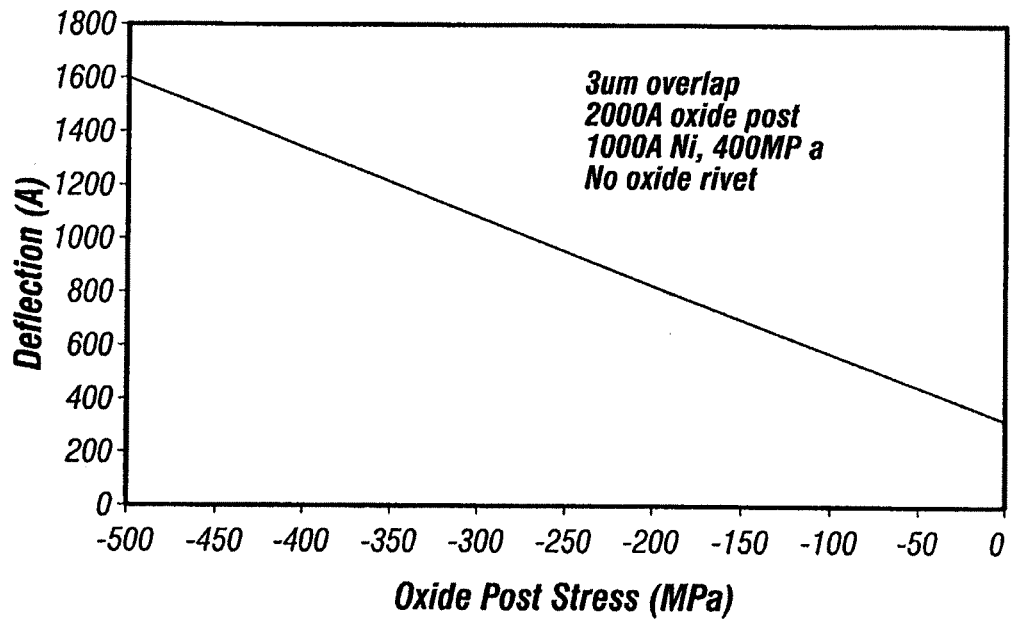

FIG. 13E shows deflections of the deformable reflective layer 130, upon release of the sacrificial layer 112, for a case similar to that of FIG. 13D (including no oxide rivet) but with a fixed oxide post 120 overlap of 3 µm (see dimensions 122 and 124 in FIGS. 12A and 12C) and varied oxide post stress levels. In this example, the positive deflections of the deformable reflective layer 130 decrease for less negative values (lower compressive stress levels) of oxide post stress. For a compressive oxide post stress level of 500 MPa, the upward deflection of the deformable reflective layer 130, upon release of the sacrificial layer 112, is about 1600 angstroms, and is about 350 angstroms for a zero stress level.

Figure 13F:
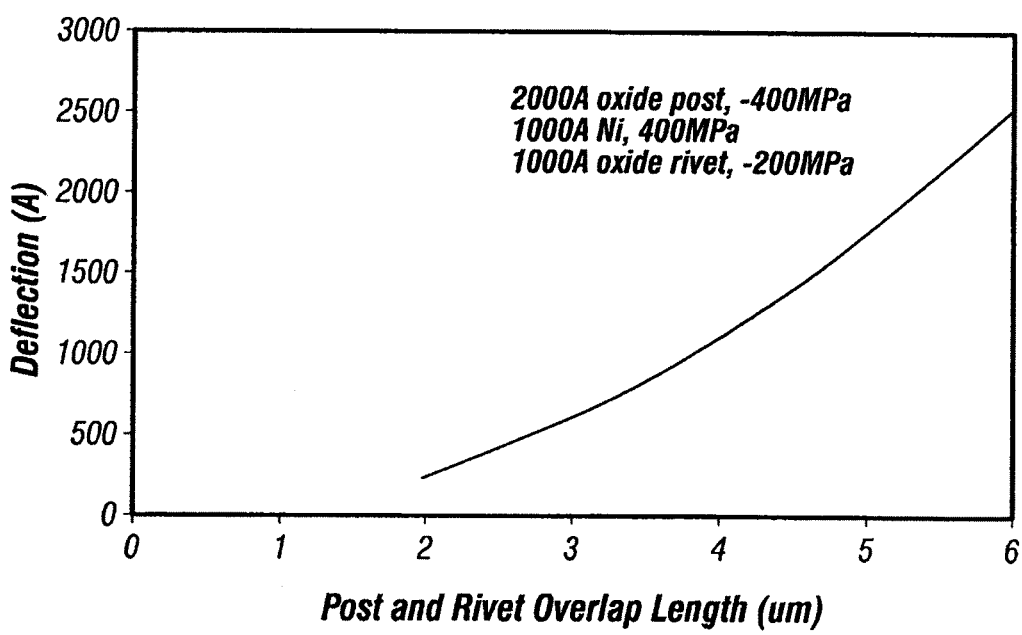

The final example includes a 2000 angstrom thick oxide post 120 with a compressive stress of −400 MPa, a 1000 angstrom thick oxide rivet 150 with a compressive stress of −200 MPa, and a 1000 angstrom thick deformable reflective Ni layer 130 with a tensile stress of 400 MPa. The overlap lengths of the post 120 (see the dimensions 122 and 124 in FIGS. 12A and 12C) and the rivet 150 (see the dimensions 123 and 125 in FIGS. 12E and 12G) are equal and are varied from about 2 µm to about 6 µm. FIG. 13F shows the estimated deflections of the deformable reflective layer 130 upon release of the sacrificial layer 112. Increasing the overlap lengths of both the post 120 and the rivet 150 increases deflections away from the substrate 100. As in the cases above, the compressed post 120 and the stretched deformable reflective layer 130 both contribute to the upward deflections and the compressed rivet 150 contributes to a downward deflection. In this case, the combined stress levels of the layer 130 and the post 120 outweigh the stress level of the rivet 150 and the deflections are all positive. By varying the overlap lengths of the oxide post 120 and the oxide rivet 150 from about 2 μm to about 6 μm, the estimated deflection of the layer 130 varies from about 250 angstroms to about 2500 angstroms.

The analytical studies of the examples discussed above show that variation in dimensions and/or characteristics of the various portions making up the flexure controller structures and/or other layers can affect the deflection of a supported layer upon release of the device. Those of skill in the art will be able to recognize other ways of modifying portions of similar types of devices in order to alter the cavity depth of the released device.

An embodiment of an unreleased interferometric modulator includes first means for reflecting light, second means for reflecting light, first means for supporting the second reflecting means, wherein the first supporting means is removable by etching, and second means for supporting the second reflecting means and for forming a cavity between the first reflecting means and the second reflecting means, upon removal of the first supporting means, of a depth about 30 percent greater or more than the depth of the first supporting means, wherein depth is measured perpendicular to the first reflecting means. With reference to FIGS. 9 and 12, aspects of this embodiment include where the first reflecting means is a partially reflective layer 104, where the second reflecting means is a movable reflective layer 14, where the first supporting means is a sacrificial layer 112, and where the second supporting means is at least one of a post structure 120 and a rivet structure 150.

Another embodiment of an unreleased interferometric modulator includes first means for reflecting light, second means for reflecting light, first means for supporting the second reflecting means, and second means for supporting the second reflecting means and for effecting a displacement of the second reflecting means towards the first reflecting means upon removal of the first supporting means, wherein the first supporting means is removable by etching. With reference to FIGS. 9 and 12, aspects of this embodiment include where the first reflecting means is a partially reflective layer 104, where the second reflecting means is a movable reflective layer 14, where the first supporting means is a sacrificial layer 112, and where the second supporting means is at least one of a post structure 120 and a rivet structure 150.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method of making an electromechanical systems device, the method comprising:
   providing a substrate;
   forming a plurality of movable elements over the substrate, wherein each movable element is separated from the substrate; and
   forming a plurality of flexure controllers over the substrate that are configured to operably support the movable elements, wherein the flexure controllers include wing portions, each wing portion being connected to a portion of a movable element which it supports, and wherein the plurality of flexure controllers include at least two flexure controllers having wing portions of differing length.

2. The method of claim 1, further including forming an electrically conductive layer over at least a portion of the substrate.

3. The method of claim 1, wherein at least a portion of each movable element is electrically conductive.

4. The method of claim 1, wherein at least a portion of each movable element includes a reflective surface.

5. The method of claim 1, wherein each of the plurality of movable elements are configured such that at least a portion of a movable element deforms in response to a deflection of a flexure controller supporting the movable element.

6. The method of claim 1, further comprising forming the plurality of flexure controllers from one or more of silicon nitride (SiN) and silicon dioxide ($SiO_2$).

7. The method of claim 1, wherein the plurality of flexure controllers are selected from post structures and rivet structures.

8. The method of claim 1, wherein the wing portions of the plurality of flexure controllers contacting respective movable elements overlap the movable elements by a distance between 1 μm to 6 μm.

9. The method of claim 1, further comprising forming a sacrificial layer upon at least a portion of the substrate.

10. The method of claim 9, further comprising removing the sacrificial layer, wherein each movable element is separated from the substrate by a cavity formed after removal of the sacrificial layer, and wherein the plurality of flexure controllers operably support the movable elements after removal of the sacrificial layer.

11. A method of making an electromechanical systems device, the method comprising:
    providing a substrate;
    forming a plurality of movable elements over the substrate, wherein each movable element is separated from the substrate; and
    forming a plurality of flexure controllers over the substrate that are configured to operably support the movable elements, wherein the flexure controllers include wing portions, each wing portion being connected to a portion of a movable element which it supports, and wherein at least a portion of at least two of the plurality of flexure controllers include wing portions of differing thickness.

12. The method of claim 11, further comprising forming an electrically conductive layer over at least a portion of the substrate.

13. The method of claim 11, wherein at least a portion of each movable element is electrically conductive.

14. The method of claim 11, wherein at least a portion of the plurality of movable elements include a reflective surface.

15. The method of claim 11, wherein each of the plurality of movable elements are configured such that at least a portion of a movable element deforms in response to a deflection of a flexure controller supporting the movable element.

16. The method of claim 11, further including forming the plurality of flexure controllers from one or more of silicon nitride (SiN) and silicon dioxide ($SiO_2$).

17. The method of claim 11, wherein the plurality of flexure controllers are selected from post structures and rivet structures.

18. The method of claim 11, wherein the thickness of the plurality of flexure controllers is selected between 1000 μm to 2000 μm.

19. The method of claim 11, further comprising forming a sacrificial layer upon at least a portion of the substrate.

20. The method of claim 19, further comprising removing the sacrificial layer, wherein each movable element is separated from the substrate by a cavity formed after removal of the sacrificial layer, and wherein the plurality of flexure controllers operably support the movable elements after removal of the sacrificial layer.

21. A method of making an electromechanical systems device, the method comprising:
providing a substrate;
forming a plurality of movable elements over the substrate, each movable element is separated from the substrate; and
forming a plurality of flexure controllers over the substrate configured so as to operably support the movable elements, wherein the flexure controllers include wing portions, each wing portion being connected to a portion of a movable element which it supports, and wherein at least two of the plurality of flexure controllers include different materials.

22. The method of claim 21, further comprising forming an electrically conductive layer over at least a portion of the substrate.

23. The method of claim 21, wherein at least a portion of each movable element is electrically conductive.

24. The method of claim 21, wherein at least a portion of the plurality of movable elements include a reflective surface.

25. The method of claim 21, wherein each of the plurality of movable elements are configured such that at least a portion of a movable element deforms in response to a deflection of a flexure controller supporting the movable element.

26. The method of claim 21, further comprising forming the plurality of flexure controllers from one or more of silicon nitride (SiN) and silicon dioxide ($SiO_2$).

27. The method of claim 21, wherein the plurality of flexure controllers are selected from post structures and rivet structures.

28. The method of claim 21, further comprising forming a sacrificial layer upon at least a portion of the substrate.

29. The method of claim 28, further comprising removing the sacrificial layer, wherein each movable element is separated from the substrate by a cavity formed after removal of the sacrificial layer, and wherein the plurality of flexure controllers operably support the movable elements after removal of the sacrificial layer.

30. A method of forming an electromechanical systems device, the method comprising:
providing a substrate;
forming a plurality of movable elements over the substrate, each movable element separated from the substrate; and
forming a plurality of flexure controllers over the substrate configured so as to operably support the movable elements, wherein the flexure controllers include wing portions, each wing portion being connected to a portion of a movable element which it supports, and wherein the flexure controllers further include tapered edges connected to the wing portions, and a base which operably supports the edges and separates the edges by a selected distance.

31. The method of claim 30, further comprising forming an electrically conductive layer over at least a portion of the substrate.

32. The method of claim 30, wherein at least a portion of each movable element is electrically conductive.

33. The method of claim 30, wherein at least a portion of the plurality of movable elements include a reflective surface.

34. The method of claim 30, wherein each of the plurality of movable elements are configured such that at least a portion of a movable element deforms in response to a deflection of a flexure controller supporting the movable element.

35. The device of claim 30, further comprising forming the plurality of flexure controllers from one or more of silicon nitride (SiN) and silicon dioxide ($SiO_2$).

36. The method of claim 30, wherein the plurality of flexure controllers are selected from post structures and rivet structures.

37. The method of claim 30, further comprising forming a sacrificial layer upon at least a portion of the substrate.

38. The method of claim 37, further comprising removing the sacrificial layer, wherein each movable element is separated from the substrate by a cavity formed after removal of the sacrificial layer, and wherein the plurality of flexure controllers operably support the movable elements after removal of the sacrificial layer.

* * * * *